US009076439B2

(12) United States Patent
Zopf

(10) Patent No.: US 9,076,439 B2
(45) Date of Patent: Jul. 7, 2015

(54) BIT ERROR MANAGEMENT AND MITIGATION FOR SUB-BAND CODING

(75) Inventor: Robert W. Zopf, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 379 days.

(21) Appl. No.: 12/907,619

(22) Filed: Oct. 19, 2010

(65) Prior Publication Data

US 2011/0099008 A1 Apr. 28, 2011

Related U.S. Application Data

(60) Provisional application No. 61/254,448, filed on Oct. 23, 2009.

(51) Int. Cl.

| | |
|---|---|
| ***G10L 21/00*** | (2013.01) |
| ***G10L 13/00*** | (2006.01) |
| ***H03M 13/00*** | (2006.01) |
| ***G10L 19/02*** | (2013.01) |
| ***G10L 19/005*** | (2013.01) |
| *G10L 25/12* | (2013.01) |

(52) U.S. Cl.

CPC .......... *G10L 19/0208* (2013.01); *G10L 19/005* (2013.01); *G10L 25/12* (2013.01)

(58) Field of Classification Search

USPC .......................................................... 704/219

See application file for complete search history.

(56) References Cited

U.S. PATENT DOCUMENTS

| | | | | |
|---|---|---|---|---|
| 4,719,642 | A * | 1/1988 | Lucas | 375/249 |
| 6,170,073 | B1 * | 1/2001 | Jarvinen et al. | 714/758 |
| 6,885,988 | B2 * | 4/2005 | Chen | 704/228 |
| 2003/0074197 | A1 * | 4/2003 | Chen | 704/262 |
| 2009/0222264 | A1 * | 9/2009 | Pilati et al. | 704/233 |
| 2010/0138724 | A1 * | 6/2010 | Fogel et al. | 714/774 |

* cited by examiner

*Primary Examiner* — David Hudspeth
*Assistant Examiner* — Timothy Nguyen
(74) *Attorney, Agent, or Firm* — Fiala & Weaver P.L.L.C.

(57) ABSTRACT

Systems and method for managing and/or mitigating the impact of bit errors on encoded frames received by an LC-SBC (Low Complexity Sub-band Coding) decoder are described herein. For example, in one embodiment, the impact of bit errors on an LC-SBC frame received by an LC-SBC decoder is estimated and one of a plurality of bit error management techniques is applied to the LC-SBC frame based on the estimated impact, wherein the bit error management techniques may include performing PLC, performing normal SBC decoding, or performing some other technique for managing and/or mitigating the impact of the bit errors. Techniques for concealing bit errors in LC-SBC frames are also described.

20 Claims, 23 Drawing Sheets

300

700

FIG. 8
Effective Lost Data
ZIR Signal
Reconverged Received Signal
Good Frame
Bad Frame
Good Frame
Good Frame

1200

1300

1400

1500

| Component | Size (bits) |
|---|---|
| Sync Word | 8 |
| Sampling Frequency | 2 |
| Block Size | 2 |
| Channel Mode | 2 |
| Allocation Method | 1 |
| # Subbands | 1 |
| Bitpool Size | 8 |
| CRC | 8 |
| Total | 32 |

FIG. 15

BIT ERROR MANAGEMENT AND MITIGATION FOR SUB-BAND CODING

CROSS-REFERENCE TO RELATED APPLICATIONS

This application claims priority to U.S. Provisional Patent Application No. 61/254,448 filed Oct. 23, 2009 and entitled "Bit Error Management and Mitigation for Sub-band Coding," the entirety of which is incorporated by reference herein.

BACKGROUND OF THE INVENTION

1. Field of the Invention

The present invention relates to digital communication systems. More particularly, the present invention relates to techniques for improving the quality of an audio signal when portions of a bit stream representing the audio signal are lost within the context of a digital communications system.

2. Background

In speech coding (sometimes called "voice compression"), a coder encodes an input speech or audio signal into a digital bit stream for transmission. A decoder decodes the bit stream into an output speech signal. The combination of the coder and the decoder is called a codec. The transmitted bit stream is usually partitioned into segments called frames, and in packet transmission networks, each transmitted packet may contain one or more frames of a compressed bit stream. In wireless or packet networks, sometimes the transmitted frames or packets are erased or lost. This condition is called frame erasure in wireless networks and packet loss in packet networks. When this condition occurs, to avoid substantial degradation in output speech quality, the decoder is sometimes configured to perform frame erasure concealment (FEC) or packet loss concealment (PLC) to try to conceal the quality-degrading effects of the lost frames. Because the terms FEC and PLC generally refer to the same kind of technique, they can be used interchangeably. Thus, for the sake of convenience, the term "packet loss concealment", or PLC, is used herein to refer to both.

Today, a growing and popular wireless communications protocol being deployed is Bluetooth®, an industrial specification for wireless personal area networks (PANs). Bluetooth® provides a way to connect and exchange information between devices such as mobile phones, laptops, personal computers, printers, headsets, etc. over a secure, globally unlicensed short-range radio frequency.

On the Bluetooth® air-interface, a 64 kb/s log pulse code modulation (PCM) format (A-law or u-law) or a 64 kb/s continuously variable slope delta (CVSD) modulation format may be used for narrowband (8 kilohertz (kHz) sampling rate) speech signals. For higher sampling rates (e.g., 16, 32, 44 kHz), the Low-Complexity Sub-band Codec (LC-SBC) may be used. LC-SBC is an audio coding system specially designed for Bluetooth® audio applications to obtain high quality audio at medium bit rates, and having a low computational complexity. LC-SBC uses four or eight sub-bands, an adaptive bit allocation algorithm, and simple adaptive block PCM quantizers. LC-SBC is fully described in Appendix B of the Advanced Audio Distribution Profile (A2DP) specification (Adopted Version 1.0, May 22, 2003)(referred to herein as "the A2DP specification"), the entirety of which is incorporated by reference herein.

PLC algorithms have been developed that may be used in conjunction with LC-SBC. For example, U.S. patent application Ser. No. 12/614,153 to Zopf et al. (entitled "Packet Loss Concealment for Sub-band Codecs" and filed on Nov. 6, 2009) describes various PLC algorithms that may be used in conjunction with LC-SBC and other sub-band codecs. When an LC-SBC frame is determined to include bit errors, the frame may be deemed lost and a PLC algorithm such as one described in U.S. patent application Ser. No. 12/614,153 may be applied to generate a replacement frame. However, it has been observed that there is wide variability in terms of the impact of random bit errors on an LC-SBC frame. Consequently, it is possible that decoding some LC-SBC frames with random bit errors will actually produce an audio signal of better quality than that produced using PLC whereas decoding other LC-SBC frames with random bit errors will produce a speech signal of lesser quality than that produced using PLC.

What is needed then is a system and method for managing and/or mitigating the impact of bit errors on LC-SBC frames received by an LC-SBC decoder. For example, one embodiment of the desired system and method should be able to estimate the impact of bit errors on an LC-SBC frame received by an LC-SBC decoder and selectively apply one of a plurality of bit error management techniques to the LC-SBC frame based on the estimated impact, wherein the bit error management techniques may include performing PLC, performing normal LC-SBC decoding, or performing some other technique for managing and/or mitigating the impact of the bit errors. The desired system and method should also operate to conceal bit errors in LC-SBC frames. The desired system and method should further be applicable to other codecs as well.

BRIEF SUMMARY OF THE INVENTION

Systems and method for managing and/or mitigating the impact of bit errors on encoded frames of an audio signal that are received for processing by a decoder are described herein. For example, in one embodiment, the impact of bit errors on an LC-SBC frame received by an LC-SBC decoder is estimated and one of a plurality of bit error management techniques is applied to the LC-SBC frame based on the estimated impact, wherein the bit error management techniques may include performing packet loss concealment (PLC), performing normal LC-SBC decoding, or performing some other technique for managing and/or mitigating the impact of the bit errors. The systems and methods described herein also operate to conceal bit errors in LC-SBC frames. The systems and methods described herein are also applicable to codecs other than LC-SBC.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 15 depicts a table that shows the components of a header of an LC-SBC frame and the size of each component in bits.

Figure 1:
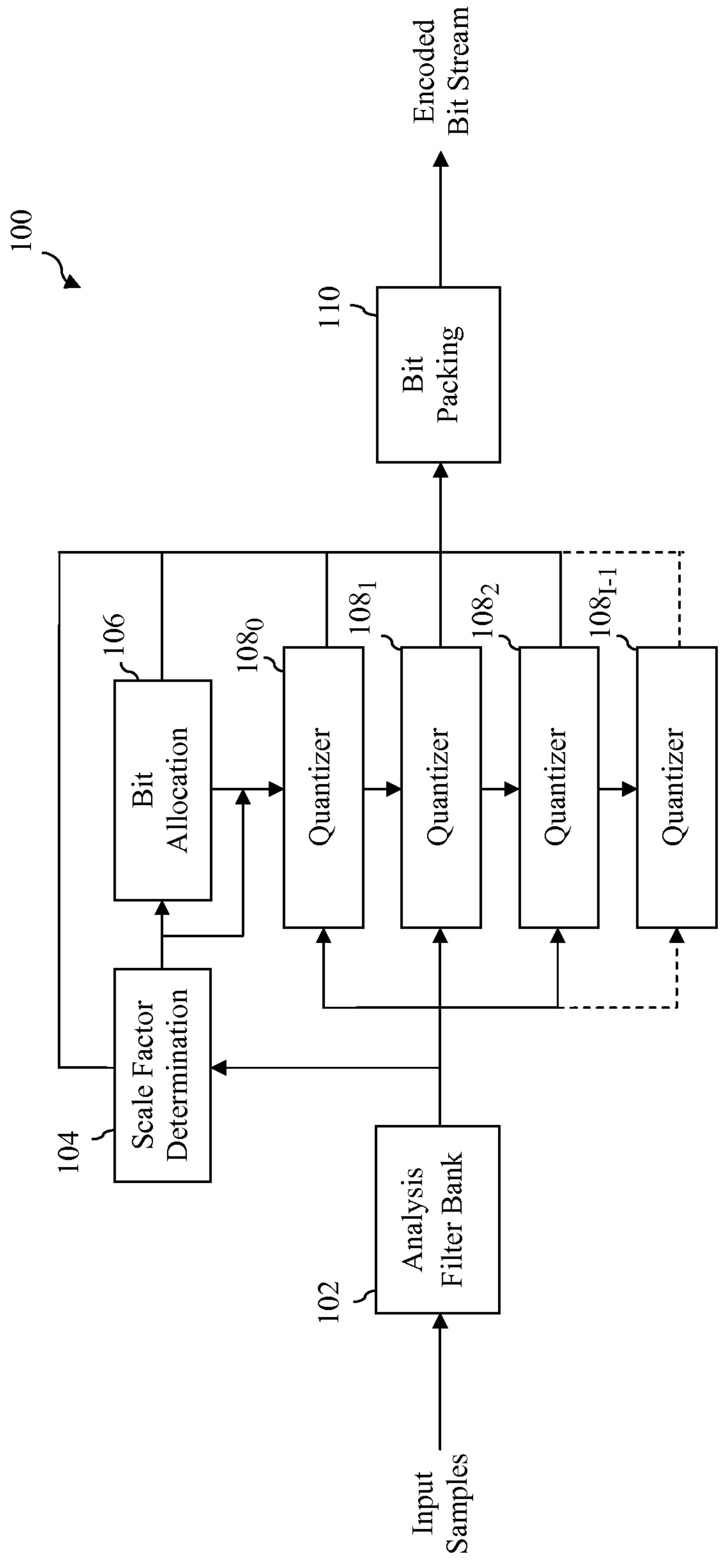
FIG. 1 is a block diagram of a conventional Low-Complexity Sub-band Coding (LC-SBC) encoder.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

A. Introduction

The following detailed description of the present invention refers to the accompanying drawings that illustrate exemplary embodiments consistent with this invention. Other embodiments are possible, and modifications may be made to the embodiments within the spirit and scope of the present invention. Therefore, the following detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

1. Low Complexity Sub-band Coding (LC-SBC)

Before describing systems and methods in accordance with embodiments of the present invention, a brief description of LC-SBC will be provided. LC-SBC is premised on an audio coding framework that was first proposed by F. de Bont et al. in "A High Quality Audio-Coding System at 128 kb/s", 98$^{th}$ AES Convention, Feb. 25-28, 1995. The audio coding framework was proposed as a simple low-delay solution for a growing number of mobile audio applications. The Bluetooth® standardization body adopted a low-complexity version of this codec as the mandatory codec for the Advanced Audio Distribution Profile (A2DP), and more recently as the mandatory codec for wideband speech communication. For the remainder of this application, this codec will be referred to as the Low-Complexity Sub-band Codec (LC-SBC). LC-SBC is a transform-based codec that relies on 4 or 8 uniformly spaced sub-bands, with adaptive block pulse code modulation (PCM) quantization and an adaptive bit-allocation algorithm. The technical specification of LC-SBC is given in "Advanced Audio Distribution Profile Specification," Appendix B, Bluetooth Audio Video Working Group, Revision V12, Apr. 16, 2007, the entirety of which is incorporated by reference herein.

FIG. 1 is a block diagram of a conventional LC-SBC encoder 100. As shown in FIG. 1, LC-SBC encoder 100 includes an analysis filter bank 102, a scale factor determination module 104, a bit allocation module 106, a plurality of quantizers $\mathbf{108}_0$-$\mathbf{108}_{I-1}$ and a bit packing module 110. LC-SBC encoder 100 is configured to operate on a frame of input samples, wherein a frame comprises a configurable number of blocks of I pulse code modulated (PCM) input samples and wherein I represents the number of sub-bands. The number of sub-bands may be 4 or 8 depending upon the implementation.

Figure 2:
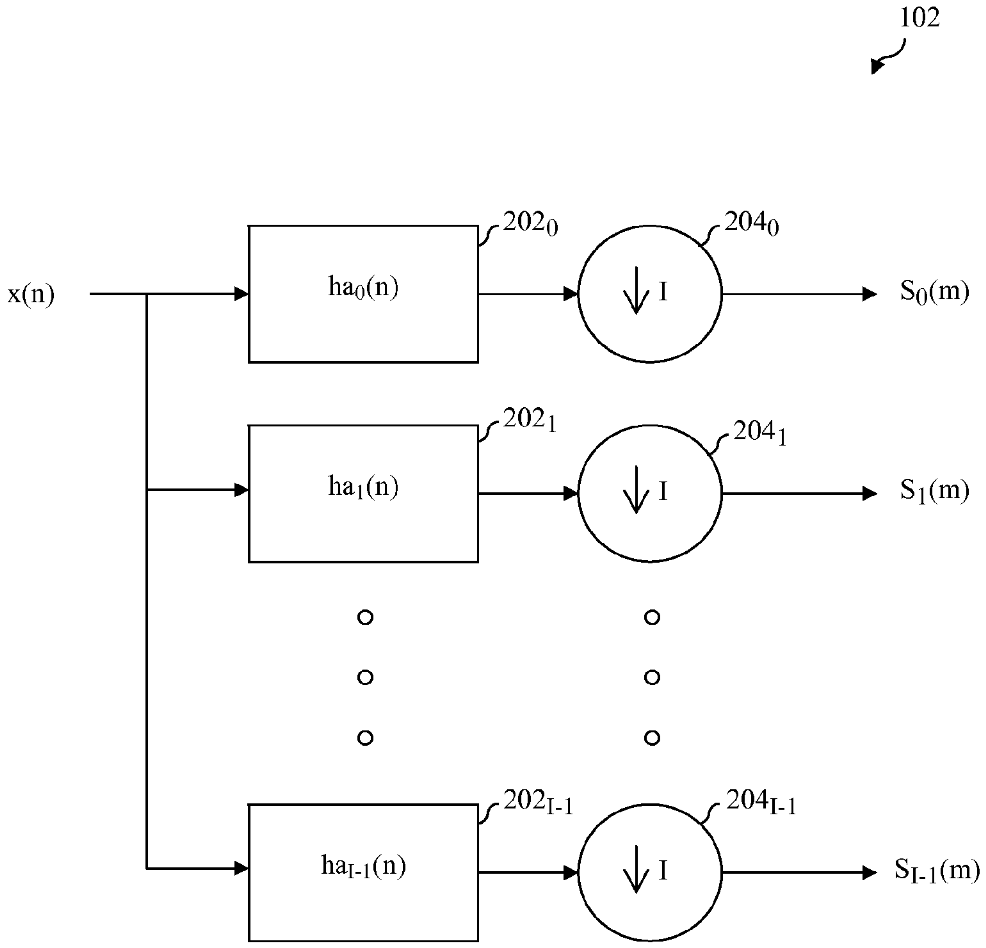
FIG. 2 is a block diagram of an analysis filter bank for an LC-SBC encoder.
Figure 3:
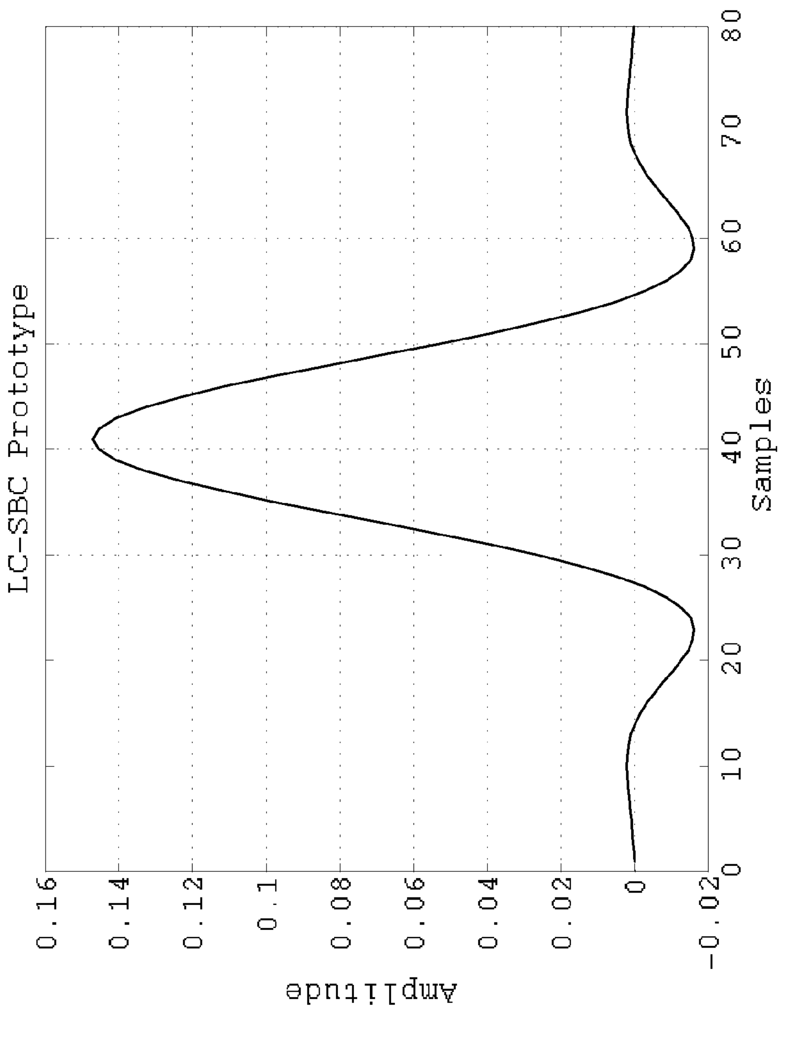
FIG. 3 depicts a prototype filter used to obtain band-pass analysis filters for use in an LC-SBC encoder and band-pass synthesis filters for use in an LC-SBC decoder.

FIG. 2 is a block diagram of analysis filter bank 102. Analysis filter bank 102 receives an audio signal represented by a series of input samples, denoted x(n), and decomposes the audio signal into a set of sub-band signals, denoted $S_0(m)$-$S_{I-1}(m)$. Analysis filter bank 102 is implemented in part by means of a bank of cosine-modulated analysis filters 202$_0$-202$_{I-1}$. A prototype filter is used to generate the individual analysis filters in accordance with equation (1):

$$ha_i[n] = p[n]\cos\left[\left(i+\frac{1}{2}\right)\left(n-\frac{I}{2}\right)\frac{\pi}{I}\right],\ n = 0, \ldots, L-1 \tag{1}$$

wherein L represents the filter length and is equal to 10*I, p[n] is the prototype filter, and $ha_i$ is the analysis filter for sub-band i, i=0, . . . , I−1. FIG. 3 depicts a graph 300 that shows the impulse response of the prototype filter p[n] for an eight sub-band implementation.

As shown in FIG. 2, the signal that is output by each analysis filter 202$_0$-202$_{I-1}$ is received by a corresponding downsampler 204$_0$-204$_{I-1}$ and downsampled by a factor of I. As a result, for every block of I samples of full-band audio signal x(n) processed, analysis filter bank 102 produces a single sample of each sub-band signal $S_0(m)$-$S_{I-1}(m)$. In the specification for LC-SBC, the application of the analysis filters and the downsampling is combined into a single LC-SBC analysis algorithm.

After analysis filter bank 102 has generated a sample of each sub-band signal $S_0(m)$-$S_{I-1}(m)$ for each block of samples of audio signal x(n) in a frame, scale factor determination module 104 determines a scale factor for each sub-band. The scale factor for a given sub-band is the largest absolute value of any sample in that sub-band. Bit allocation module 106 then determines a number of bits to be allocated to each sub-band. Bit allocation module 106 may use one of two processes to perform this function depending upon the configuration. One process attempts to improve the ratio between the audio signal and the quantization noise, while the other accounts for human auditory sensitivity. Both processes rely on the scale factor associated with each sub-band and the location of the sub-band to determine how many bits should be dedicated to each sub-band. Regardless of which process is used, bit allocation module 106 generally allocates larger numbers of bits to lower-frequency sub-bands having larger scale factors.

Each of quantizers 108$_0$-108$_{I-1}$ receives the set of samples corresponding to each sub-band signal $S_0(m)$-$S_{I-1}(m)$ from analysis filter bank 102, the scale factor associated with each sub-band from scale factor determination module 104, and the number of bits to be allocated to each sub-band from bit allocation module 106. Each of quantizers 108$_0$-108$_{I-1}$ quantizes the scale factor by taking the next higher powers of 2. Each of quantizers 108$_0$-108$_{I-1}$ then normalizes the sub-band samples by the quantized scale factor. Then each of quantizers 108$_0$-108$_{I-1}$ quantizes the normalized blocks of sub-band samples in accordance with equation (2):

$$\overline{S}_i[m] = \left(\frac{\hat{S}_i[m]}{2^{SCF_i}}+1\right)\left(\frac{2B_i}{2}\right) \tag{2}$$

wherein $\overline{S}_i[m]$ and $\hat{S}_i[m]$ represent the quantized and original normalized sub-band sample m from sub-band i, i=0, . . . , I−1. The quantized scale factor for sub-band i and the number of bits allocated to it are represented by $SCF_i$ and $B_i$, respectively.

Bit packing module 110 receives bits representative of the quantized scale factors and quantized sub-band samples from each of quantizers 108$_0$-108$_{I-1}$ and arranges the bits in a manner suitable for transmission to an LC-SBC decoder.

Figure 4:
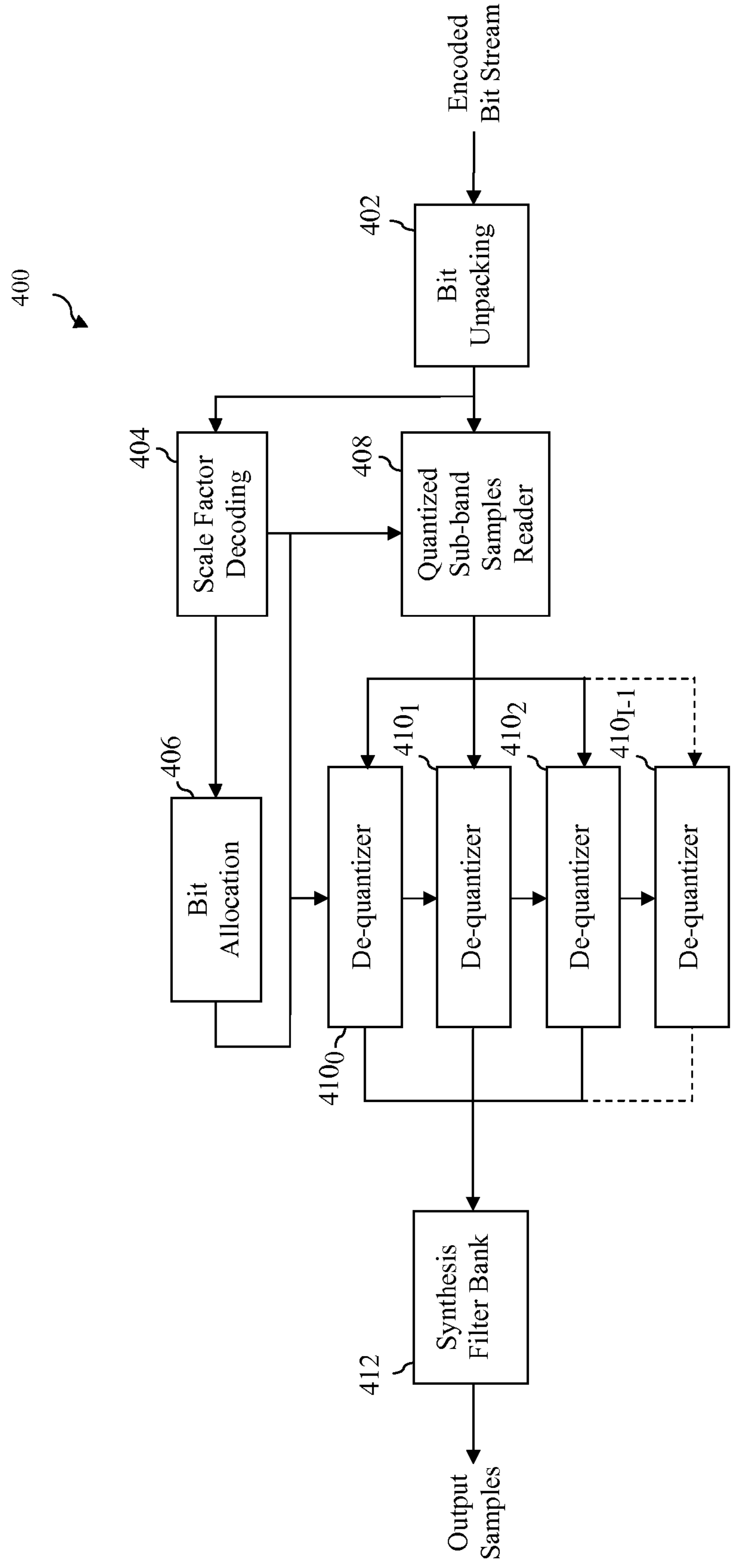
FIG. 4 is a block diagram of a conventional LC-SBC decoder.

FIG. 4 is a block diagram of a conventional LC-SBC decoder 400. As shown in FIG. 4, LC-SBC decoder 400 includes a bit unpacking module 402, a scale factor decoding module 404, a bit allocation module 406, a quantized sub-band samples reader 408, a plurality of de-quantizers 410$_0$-410$_{I-1}$ and a synthesis filter bank 412.

Bit unpacking module 402 receives an encoded bit stream representative of a frame of an audio signal from an LC-SBC encoder (such as LC-SBC encoder 100), from which it extracts bits representative of quantized scale factors and quantized sub-band samples.

Scale factor decoding module 404 receives the quantized scale factors from bit unpacking module 402 and de-quantizes the quantized scale factors to produce a scale factor for each of 4 or 8 sub-bands, depending upon the implementation. Bit allocation module 406 receives the scale factors from scale factor decoding module 404 and operates in a like manner to bit allocation module 106 of LC-SBC encoder 100 to determine a number of bits to be allocated to each sub-band based on the scale factors and the locations of the sub-bands.

Quantized sub-band samples reader 408 receives the number of bits to be allocated to each sub-band from bit allocation module 406 and uses this information to properly extract quantized sub-band samples associated with each sub-band from bits provided by bit unpacking module 402.

Each of de-quantizers 410$_0$-410$_{I-1}$ receives a number of quantized sub-band samples corresponding to a particular sub-band from quantized sub-band samples reader 408, a quantized scale factor associated with the particular sub-band from bit unpacking module 402, and a number of bits to be allocated to the particular sub-band from bit allocation module 406. Using this information, each of de-quantizers 410$_0$-410$_{I-1}$ operates in an inverse manner to quantizers 108$_0$-108$_{I-1}$ described above in reference to LC-SBC encoder 100 to produce a number of de-quantized sub-band samples for each sub-band. A single de-quantized sub-band sample is produced for each block in the frame being decoded.

Figure 5:
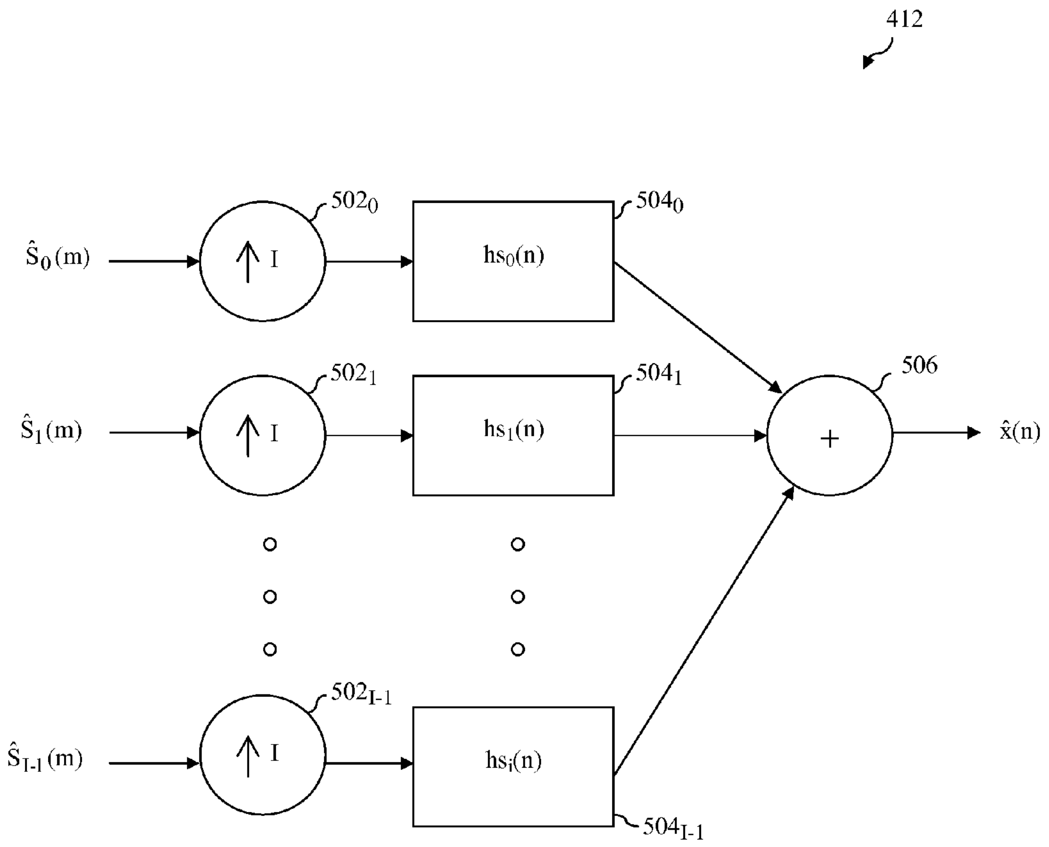
FIG. 5 is a block diagram of a synthesis filter bank for an LC-SBC encoder.

Synthesis filter bank 412 receives the de-quantized sub-band samples from each of de-quantizers 410$_0$-410$_{I-1}$ and combines them to produce a frame of output samples representative of the original audio signal. FIG. 5 is a block diagram of synthesis filter bank 412. As shown in FIG. 5, synthesis filter bank 412 is implemented in part by means of a bank of cosine-modulated synthesis filters 504$_0$-504$_{I-1}$. A prototype filter is used to generate the individual synthesis filters in accordance with equation (3):

$$hs_i[n] = p[n]\cos\left[\left(i+\frac{1}{2}\right)\left(n+\frac{I}{2}\right)\frac{\pi}{I}\right],\ n = 0, \ldots, L-1 \tag{3}$$

wherein L represents the filter length and is equal to 10*I, p[n] is the prototype filter described above (the impulse response of which is shown in FIG. 3 for an eight sub-band implementation), and $hs_i$ is the synthesis filter for sub-band i, i=0, . . . , I−1.

As shown in FIG. 5, the de-quantized sub-band samples received from each of de-quantizers 410$_0$-410$_{I-1}$ may be represented as signals $\hat{S}_0(m)$-$\hat{S}_{I-1}(m)$. Each of these signals is received by a corresponding upsampler 502$_0$-502$_{I-1}$ and upsampled by a factor of I prior to being processed by a corresponding synthesis filter 504$_0$-504$_{I-1}$. The upsampled and synthesis filtered signals are then combined by a combiner 506. By operating on a single sample of each sub-band in parallel, synthesis filter bank 412 produces a block of I samples of a full-band decoded audio signal $\hat{x}(n)$. In the specification for LC-SBC, the upsampling, the application of the synthesis filters, and the combination of the upsampled and synthesis filtered signals is combined into a single LC-SBC synthesis algorithm.

2. Example Packet Loss Concealment (PLC) Scheme for LC-SBC

Before describing systems and methods in accordance with embodiments of the present invention, a description of an example PLC technique that may be used with LC-SBC and other sub-band codecs will also be provided. This PLC technique was also described in U.S. patent application Ser. No. 12/614,153 to Zopf et al. (entitled "Packet Loss Concealment for Sub-band Codecs" and filed on Nov. 6, 2009), but is presented again herein for the sake of illustration.

In the following description, it will be assumed that the example PLC technique is being used in conjunction with an implementation of LC-SBC that has 8 sub-bands, an 8 millisecond (ms) frame size, and a bit rate of 62 kilobits per second (kbit/s) at a sampling rate of 16 kilohertz (kHz). Such an implementation will have 16 8-sample blocks per frame. This configuration is used for illustrative purposes only.

Figure 6:
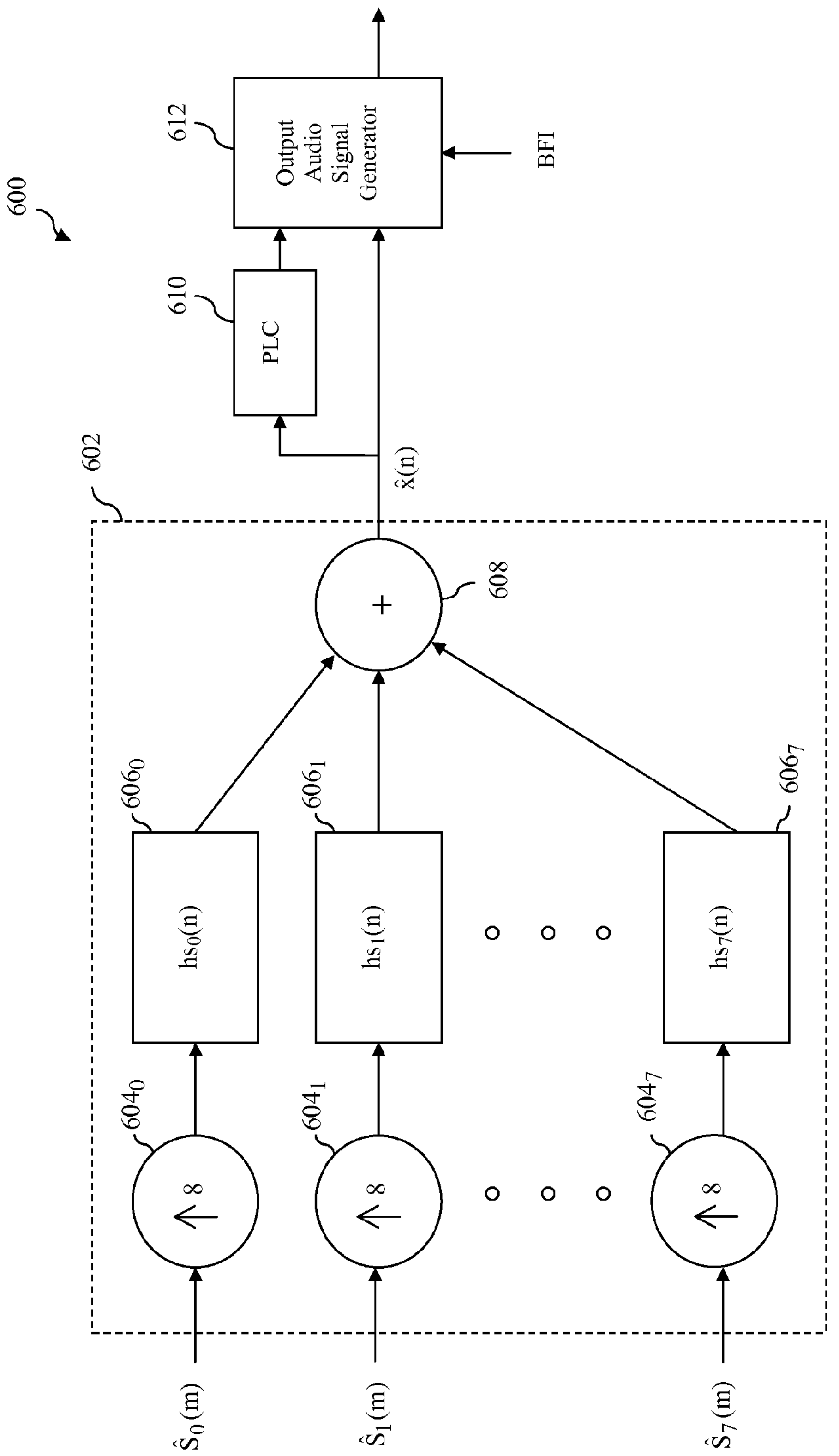
FIG. 6 is a block diagram of a system that implements a full-band domain packet loss concealment (PLC) scheme for LC-SBC.

FIG. 6 is a block diagram of a system 600 that implements the exemplary PLC technique. As shown in FIG. 6, system 600 includes a synthesis filter bank 602 that comprises a plurality of upsamplers 604$_0$-604$_7$, a plurality of synthesis filters 606$_0$-606$_7$, and a combiner 608. Synthesis filter bank 602 operates on sub-band signals $\hat{S}_0(m)$-$\hat{S}_7(m)$ to produce a full-band audio signal $\hat{x}(n)$ in a like manner to synthesis filter bank 412 described above in reference to conventional LC-SBC decoder 400. System 600 further includes a PLC module 610 that uses the full-band audio signal $\hat{x}(n)$ as input to produce a full-band concealment signal in the presence of errors, as signaled by a bad frame indicator (BFI). PLC module 610 may employ any of a wide variety of known PLC techniques, such as periodic waveform extrapolation (PWE), to generate the concealment signal based on the full-band audio signal $\hat{x}(n)$.

An output audio signal generator 612 generates the system output signal by selectively switching between the full-band audio signal $\hat{x}(n)$ produced by synthesis filter bank 602 and the full-band concealment signal produced by PLC module 610 based on the state of the BFI. Generally speaking, when a frame is determined to be good, the full-band audio signal $\hat{x}(n)$ produced by synthesis filter bank 602 will be provided as the output audio signal and when a frame is determined to be bad, the full-band concealment signal produced by PLC module 610 will be provided as the output signal. However, during the first bad frame in a period of frame loss and during the first good frame after a period of frame loss, output audio signal generator 612 generates a frame of the output audio signal in a particular manner that will be described below.

When using a full-band domain PLC scheme such as that implemented by system 600, memory contained in the synthesis filter bank must be handled appropriately during a bad frame. It can be seen from FIG. 3 that the prototype low-pass filter from which the synthesis filters are derived is of length 80 samples which equates to 5 ms at a 16 kHz sampling rate. As shown in FIG. 6, the synthesis filters are applied after 8:1 upsampling. Therefore, in each sub-band, there is a 10 sample buffer that accounts for 5 ms of samples at a 2 kHz sub-band sampling rate. During normal decoding, each sub-band sample is shifted into the respective buffer, one sample at a time, for the duration of the frame. Since a frame in the exemplary configuration of LC-SBC includes 16 blocks, this means 16 samples (m=0 . . . 15) will be shifted into each buffer, one sample at a time, for the duration of the frame. Hence, at the end of a frame, each buffer will contain the last 9 samples, $\hat{S}_i(m)$, m=7, . . . , 15, for use in the next frame. The last sample, $\hat{S}_i(15)$, will remain in the buffer for 9 sub-band samples, or 4.5 ms. In the full-band 16 kHz domain, this translates to 72 samples or, once again, 4.5 ms of memory in the synthesis filter bank.

During a frame loss, the sub-band samples $\hat{S}_i(m)$, m=7, . . . , 15 are not available, which means that the synthesis filter bank will require 4.5 ms for these missing samples to flush out of the buffers and for the output signal to completely re-converge with the true output signal. This can be seen in FIG. 7, which is a graph 700 comparing an input audio file with the output of an LC-SBC decoder in the presence of packet loss. In this example, the filter bank memory is left unchanged during the lost frame. It can be seen that if the filter memory is not handled appropriately, the effective length of the packet loss (including memory re-convergence effects) is up to 200 samples or 12.5 ms.

One approach to addressing this issue involves exploiting the buffers in the synthesis filter bank in the first bad frame in a period of frame loss to offset the re-convergence in the first good frame after the period of frame loss. Just as the samples $\hat{S}_i(m)$, m=7, . . . , 15 from the last bad frame are not available in the first good frame as discussed above, the samples $\hat{S}_i(m)$, m=7, . . . , 15 from the last good frame are still buffered in the synthesis filter bank at the start of the first bad frame. The full-band 16 kHz signal produced by these buffered sub-band samples is the zero-input response of the synthesis filter bank. It is obtained by setting $\hat{S}_i(m)=0$, m=0, . . . , 8; i=0, . . . , 7 to produce 72 full-band 16 kHz samples. The resulting signal may be denoted $x_{ZIR}$ Since this signal has passed through the synthesis filter bank, it has been filtered by modulated versions of the prototype low-pass filter p(n) depicted in FIG. 3. As such, not all of the 72 samples will be usable. However, the energy in p(n) does not ramp up for approximately 30-40 samples, indicating that $$x_{ZIR}(n) \approx \hat{x}(n) \quad n=0, \ldots, \approx 30\text{-}40 \tag{4}$$

Figure 7:
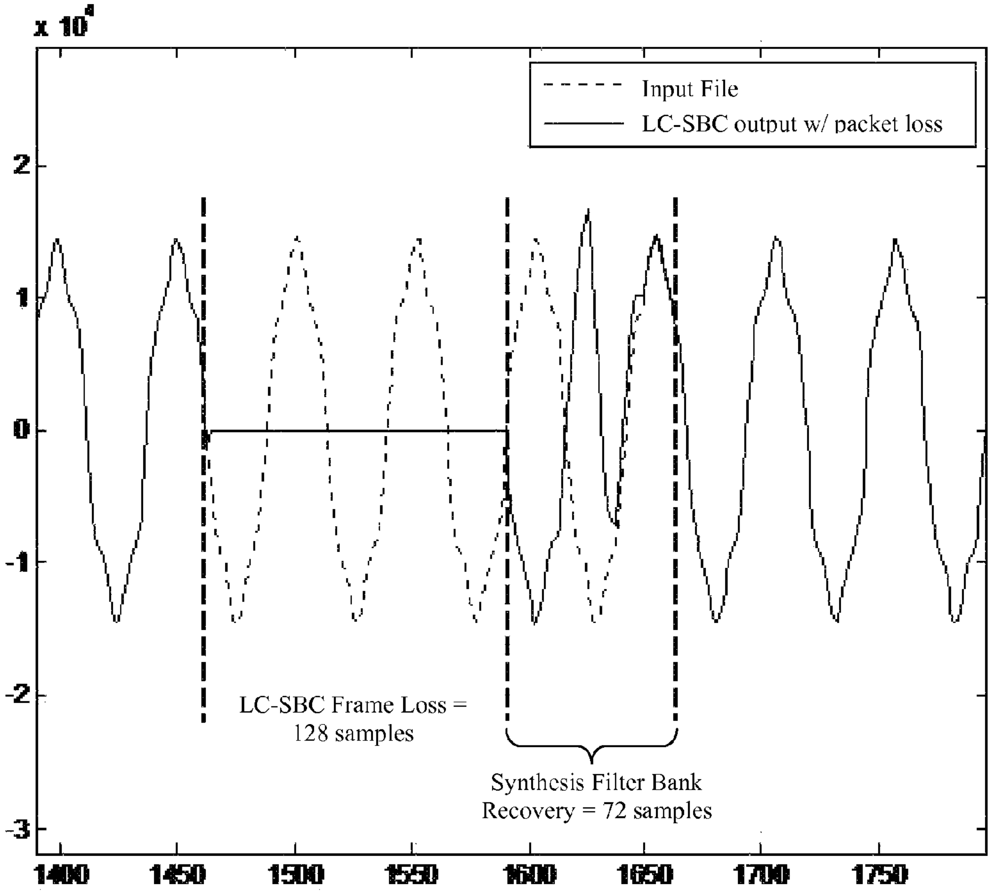
FIG. 7 is a graph showing an effect of synthesis re-convergence after packet loss at the output of an LC-SBC decoder.

Now consider the re-convergence issue in the first good frame after frame loss, as illustrated in FIG. 7. If the memory of the synthesis filter bank is set to zero during a lost frame, then the output of the synthesis filter bank in the first good frame after a period of frame loss will be entirely attributable to the sub-band signals received in that first good frame. The contribution to the output signal $\hat{x}(n)$ from the synthesis filter memory will be zero. This signal is commonly referred to as the zero-state response of a filter. Denote $x_{ZSR}(n)$ the signal obtained in the first good frame by setting the filter memory to zero. In a like manner to the ZIR signal mentioned above, this ZSR signal will ramp up as the received sub-band signals are passed through the synthesis filter bank and:

$$x_{ZSR}(n) \approx \hat{x}(n) \quad n=\approx 40\text{-}50, \ldots, 71 \tag{5}$$

$$x_{ZSR}(n)=\hat{x}(n) \quad n=72, \ldots, 127. \tag{6}$$

Figure 8:
FIG. 8 illustrates an effective location of lost data when utilizing a zero-input response of a synthesis filter bank to perform PLC for LC-SBC.

Although re-convergence time may be considered a disadvantage of the full-band domain based PLC approach described above, the samples lost during re-convergence in the first good frame may be almost completely compensated for by the samples gained using $x_{ZIR}(n)$ in the first bad frame. This has the effect of essentially shifting the lost frame by the delay of the synthesis filter bank as illustrated in FIG. 8. Thus, the PLC technique described in this section utilizes an overlap-add in the 16 kHz domain to transition between the last good frame and the concealment signal and then to the signal received in the first good frame.

Figure 9:
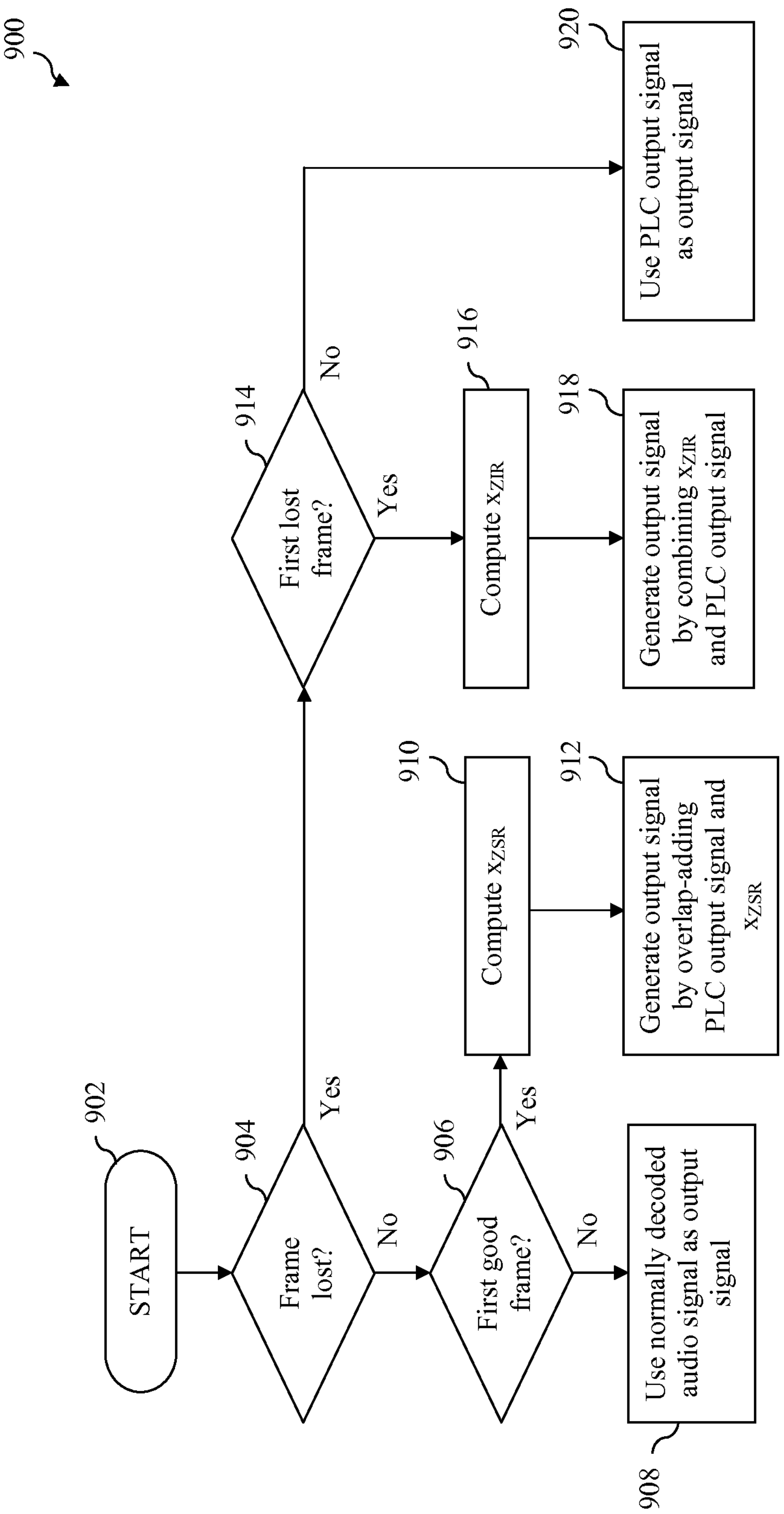
FIG. 9 illustrates a method that may be used to perform full-band domain PLC for LC-SBC.

This method is illustrated by flowchart 900 of FIG. 9. The method of flowchart 900 may be implemented, for example, by output audio signal generator 612 of FIG. 6. The method illustrates the processing of a single frame of an encoded audio signal.

As shown in FIG. 9, the method of flowchart 900 begins at node 902, denoted "start." Control then flows to decision step 904, in which it is determined whether or not a frame has been lost. If the frame has not been lost, then control flows to decision step 906, in which it is determined whether the frame is the first good frame after a period of frame loss. If the frame is not the first good frame after a period of frame loss, then control flows to step 908 in which the normally decoded full-band audio signal $\hat{x}(n)$ is provided as the output signal.

Returning now to decision step 904, if it is determined during that step that the frame is lost, then control flows to decision step 914, in which it is determined whether the lost frame is the first lost frame in a period of frame loss. If the lost frame is not the first lost frame in a period of frame loss, then control flows to step 920 in which a PLC output signal generated by a PLC module that operates on previously-received portions of the full-band audio signal $\hat{x}(n)$ is provided as the output signal. However, if the lost frame is the first lost frame in a period of frame loss, then control flows to step 916, in which $x_{ZIR}(n)$ is computed in the manner described above. At step 918, the output audio signal is generated by combining a segment of $x_{ZIR}(n)$ and a segment of the PLC output signal generated by the PLC module.

Figure 10:
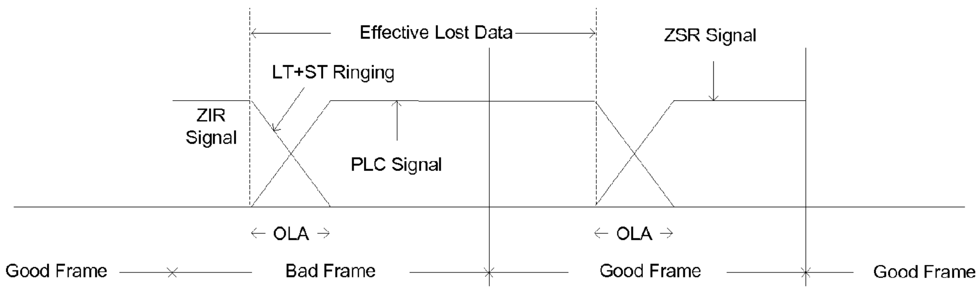
FIG. 10 is a diagram that illustrates frames generated using a full-band domain PLC algorithm for LC-SBC.

Note that in reference to steps 918 and 920 any PLC algorithm may be used to generate the PLC output signal. For example, a low-complexity PLC algorithm described in commonly-owned, co-pending U.S. patent application Ser. No. 12/147,781 to Juin-Hwey Chen entitled "Low-Complexity Packet Loss Concealment" and filed on Jun. 27, 2008 (the entirety of which is incorporated by reference herein), may be modified for 16 kHz input and used. As shown in FIG. 10, during the first bad frame, the $x_{ZIR}(n)$ signal is treated as original received signal, thus reducing the effective length of the bad frame. Only the linear region (with only minor windowing due to the front tail of the sub-band filters) of $x_{ZIR}(n)$ should be used. For the specified configuration of LC-SBC, a length of 30 samples may be used. As specified in the aforementioned U.S. patent application Ser. No. 12/147,781, an overlap-add between the ringing of short-term and long-term prediction filters and the PLC output signal may also be performed during the first bad frame to avoid discontinuities. This is also reflected in FIG. 10.

It is noted that the incorporation of the linear region of $x_{ZIR}(n)$ into the PLC computation described by U.S. patent application Ser. No. 12/147,781 will have the advantageous effect of improving pitch estimation, LPC analysis, ringing, etc. This is because the linear region of $x_{ZIR}(n)$ provides samples that are closer in time to the frame loss to include in the analysis window for computing these parameters.

Returning now to decision step 906, if it is determined during that step that the frame is the first good frame after a period of frame loss, then control flows to step 910, during which $x_{ZSR}(n)$ is computed in the manner described above. At step 912, the output signal is generated by performing an overlap add between a segment of the PLC output signal and a segment of $x_{ZSR}(n)$. The PLC output signal should preferably be extended beyond the frame boundary to the point where $x_{ZSR}(n)$ has reconverged enough to be usable in the overlap-add. For the exemplary LC-SBC configuration specified earlier in this section, the PLC output signal is preferably extended by 38 samples and the overlap-add length is preferably 40 samples. FIG. 10 also illustrates the overlap-add of the PLC output signal and $x_{ZSR}(n)$ in the first good frame.

B. Bit Error Management and Mitigation for Sub-band Coding

1. Problem Definition

Figure 11:
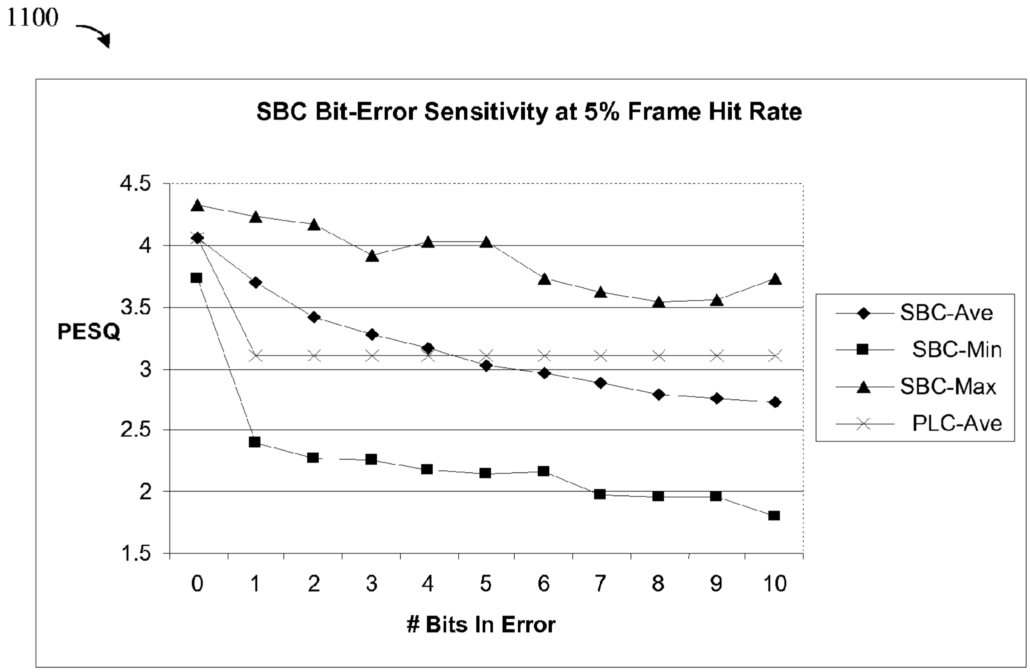
FIG. 11 is a graph that shows the quality of an audio signal generated using both LC-SBC decoding and a PLC technique as a function of a number of random bit errors introduced into a series of LC-SBC frames.

LC-SBC is very sensitive to random bit errors. This is illustrated, for example, by graph 1100 of FIG. 11. In particular, graph 1100 of FIG. 11 shows the quality of a speech signal generated using both normal LC-SBC decoding and the particular PLC technique described in Section A.2 above as a function of the number of random bit errors introduced into a series of LC-SBC frames, wherein the quality is measured by Perceptual Evaluation of Speech Quality (PESQ) standards. During the simulation, the bit errors were introduced at a 5% frame hit rate. Graph 1100 of FIG. 11 shows the best performance achieved by the LC-SBC decoder during the simulation, which is represented as "SBC-Max," the worst performance achieved by the LC-SBC decoder during the simulation, which is represented as "SBC-Min," and the average performance achieved by the LC-SBC decoder during the simulation, which is represented as "SBC-Ave". The performance achieved by the PLC technique is represented as "PLC-Ave."

As shown by graph 1100 of FIG. 11, the level of performance of LC-SBC decoding varies widely when random bit errors are present in the LC-SBC frames. Consequently, it is difficult to tell for any particular LC-SBC frame when the PLC approach will produce a better quality speech signal than straightforward LC-SBC decoding. However, graph 1100 does show that, on average, this particular PLC approach will out-perform LC-SBC decoding when the number of bit errors exceeds 4. Thus, one approach to mitigating the effect of bit errors in LC-SBC frames would be to detect or estimate the number of bit errors in a frame and then, if the number of bit errors exceeds a predefined threshold (e.g., 4 bits in accordance with the example PLC implementation used to generate graph 1100 of FIG. 11), perform PLC. Otherwise, use LC-SBC decoding. However, this approach is imperfect in that there will be instances where the number of bit errors exceeds the threshold but better performance would still be obtained by using LC-SBC decoding.

Figure 12:
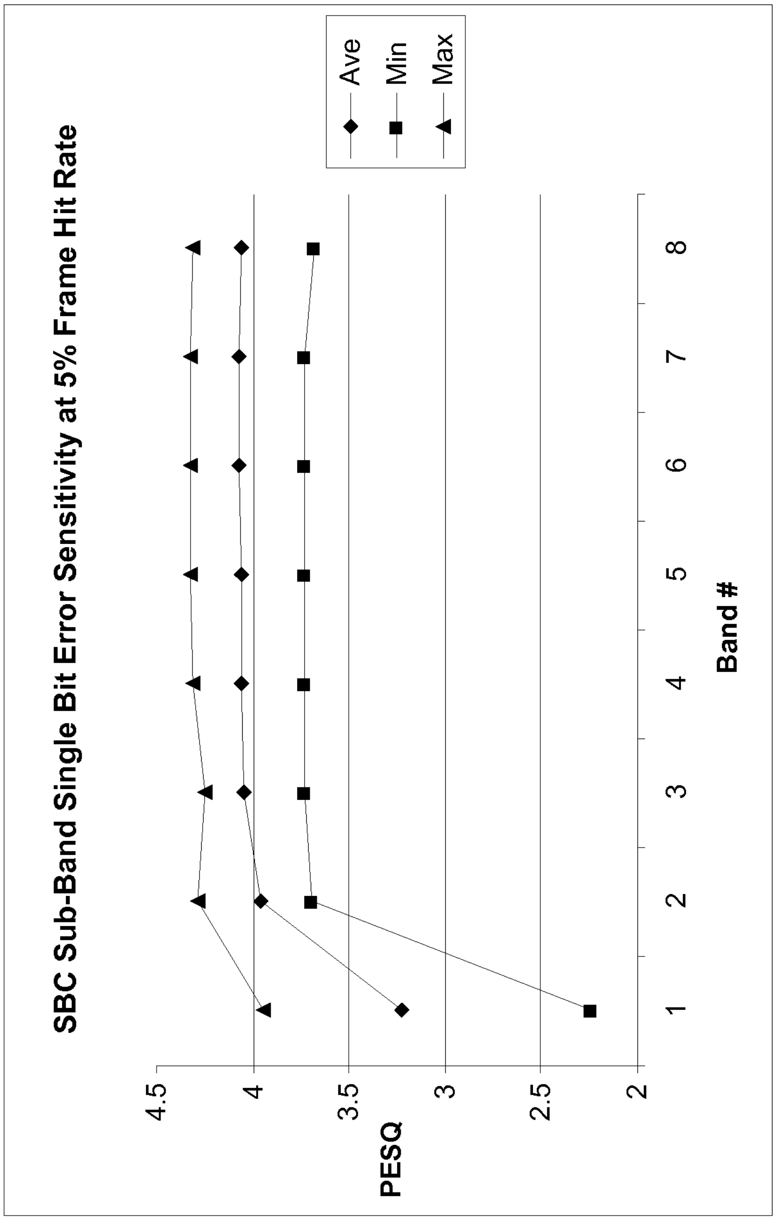
FIG. 12 is a graph that shows the quality of an audio signal generated by decoding an LC-SBC frame when a single bit error is introduced into the quantized sub-band samples associated with each sub-band included in the LC-SBC frame.

Certain embodiments of the present invention described herein are premised on the observation that the bit error sensitivity of LC-SBC is sub-band dependent. To help illustrate this, FIG. 12 depicts a graph 1200 that shows the quality of a speech signal generated by decoding an LC-SBC frame when a single bit error is introduced into the quantized sub-band samples associated with each sub-band included in the LC-SBC frame. During the simulation, the bit errors were introduced at a 5% frame hit rate. The quality of the speech signal was measured using PESQ. In the graph, sub-band 1 corresponds to the lowest-frequency sub-band, sub-band 2 corresponds to the next highest-frequency sub-band relative to sub-band 1, and so forth and so on up to sub-band 8 which corresponds to the highest-frequency sub-band of all the sub-bands. Graph 1200 of FIG. 12 shows the best performance achieved by the LC-SBC decoder during the simulation, which is represented as "Max," the worst performance achieved by the LC-SBC decoder during the simulation, which is represented as "Min," and the average performance achieved by the LC-SBC decoder during the simulation, which is represented as "Ave".

As shown by graph 1200 of FIG. 12, the lowest-frequency sub-band is the most sensitive to bit errors. That is to say, the quality of the decoded speech signal degrades the most when a single bit error is introduced into the bits that represent the sub-band samples associated with the lowest-frequency sub-band. This makes sense, since most of the information in a speech signal is contained in the lowest frequency sub-band.

Figure 13:
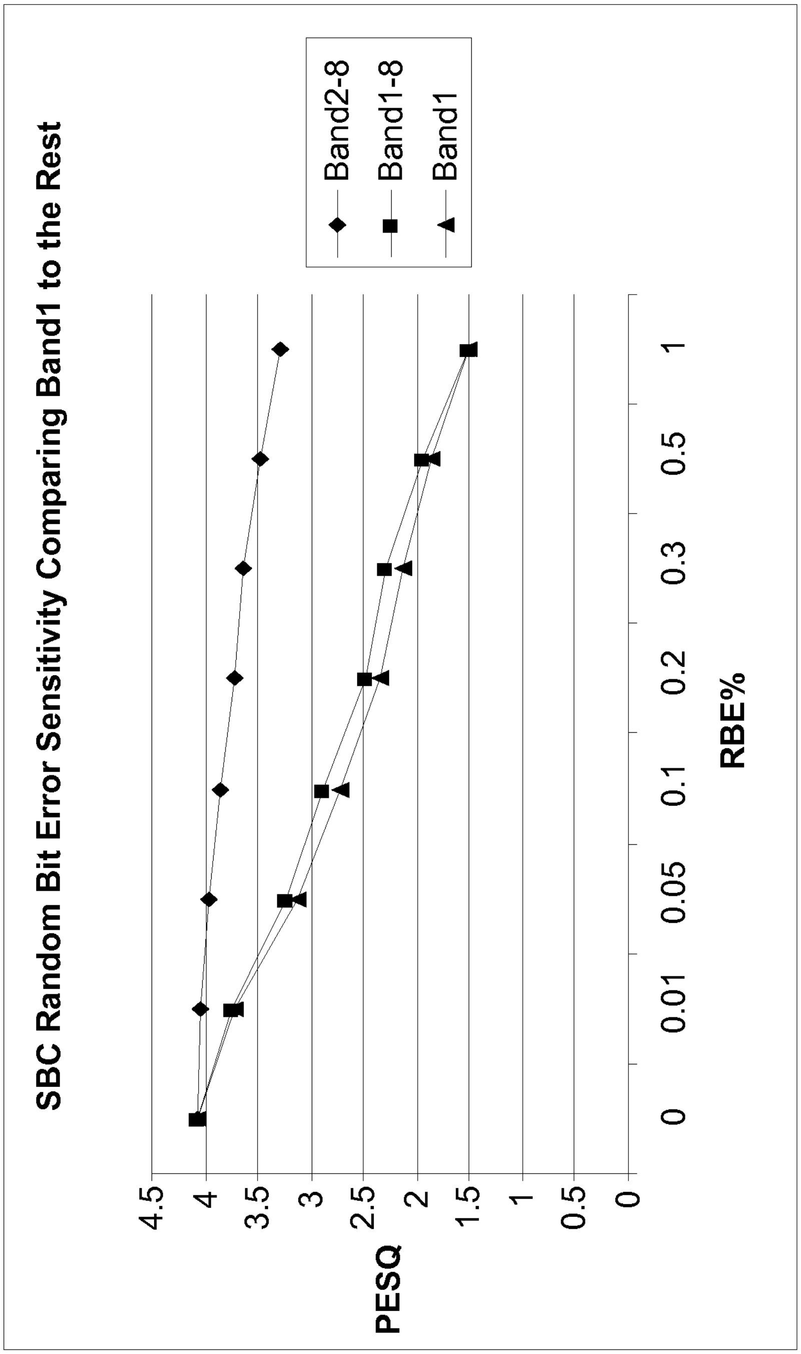
FIG. 13 is a graph that shows the quality of an audio signal generated by decoding an LC-SBC frame as a function of the percentage of random bit errors introduced into various sets of quantized sub-band samples included in the LC-SBC frame.

FIG. 13 depicts a graph 1300 that further demonstrates that the bit error sensitivity of LC-SBC is sub-band dependent. In particular, graph 1300 of FIG. 13 shows the quality of a speech signal generated by decoding an LC-SBC frame as a function of the percentage of random bit errors introduced into various sets of quantized sub-band samples included in the LC-SBC frame. The quality of the speech signal was measured using PESQ. Graph 1300 of FIG. 13 shows the performance achieved when bit errors were introduced into the quantized sub-band samples associated with lowest-frequency sub-band only, which is represented as "Band1," when bit errors were introduced into the quantized sub-band samples associated with the seven highest-frequency sub-bands only, which is represented as "Band2-8," and when bit errors were introduced into the quantized sub-band samples associated with all eight sub-bands, which is represented as "Band1-8."

As shown by graph 1300 of FIG. 13, the speech quality obtained when bit errors are introduced into the quantized sub-band samples associated with the seven highest-frequency sub-bands is considerably higher than that obtained when bit errors are introduced into the quantized sub-band samples associated with the lowest-frequency sub-band or with all the sub-bands. This suggests that the bits that represent the sub-band samples associated with the lowest-frequency sub-band are by far the most sensitive to bit errors.

Figure 14:
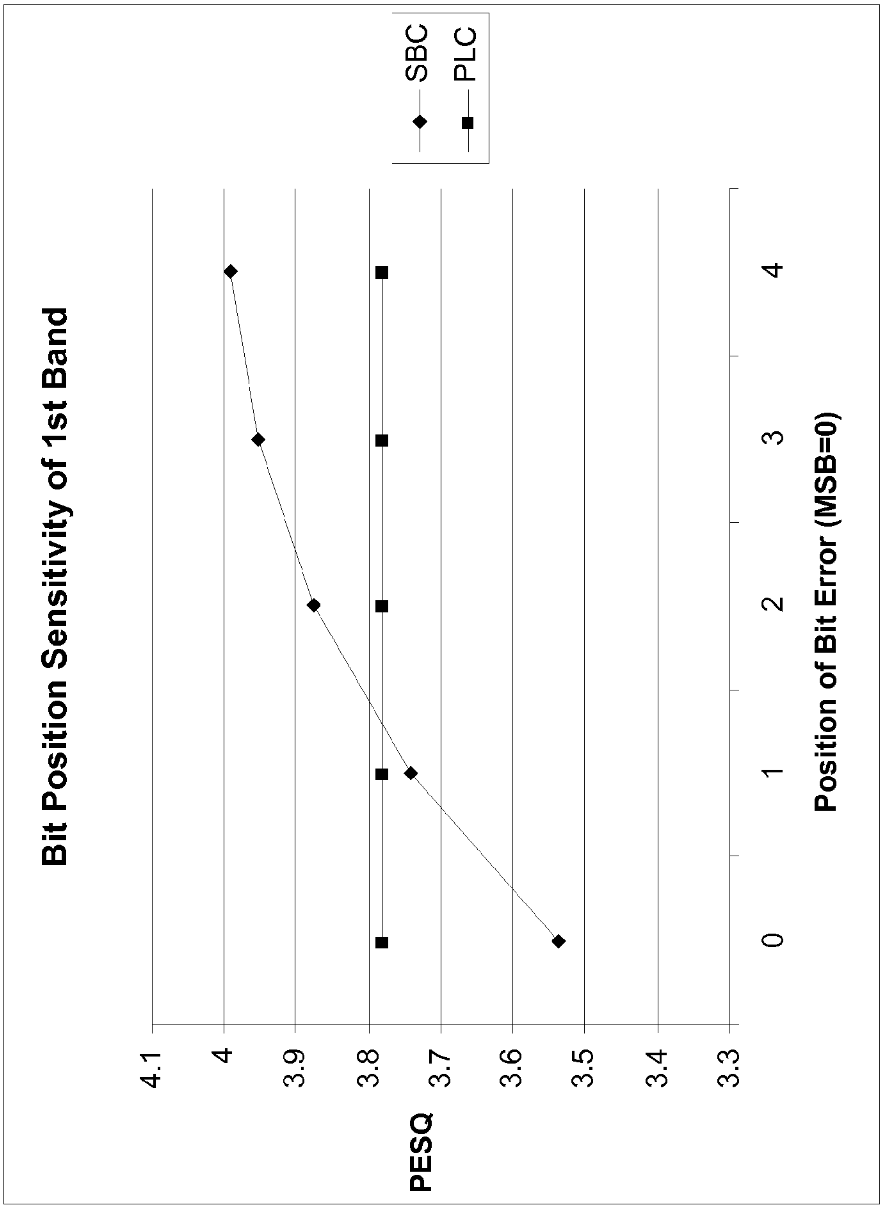
FIG. 14 is a graph that shows the quality of an audio signal generated by decoding an LC-SBC frame when bit errors are introduced at a 0.1% rate into the different bit positions used to represent quantized sub-band samples associated with the lowest-frequency sub-band.

Certain embodiments of the present invention are also premised on the further observation that the bit-error sensitivity of the bits representing the lowest-frequency sub-band samples is attributable largely to only a subset of those bits—namely, the first and second most significant bits (MSBs). FIG. 14 depicts a graph 1400 that illustrates this. In particular, graph 1400 of FIG. 14 shows the quality of a speech signal generated by decoding an LC-SBC frame when bit errors are introduced at a 0.1% rate into the different bit positions used to represent the lowest-frequency sub-band samples. The performance of LC-SBC decoding is represented as "SBC." As shown by graph 1400, the greatest degradation in speech quality occurs when bit errors are introduced into the first MSB (denoted position "0"), the second-greatest degradation in speech quality occurs when bit errors are introduced into the second MSB (denoted position "1"), and so forth and so on up to the fifth MSB (denoted position "4").

Graph 1400 of FIG. 14 also shows the performance of the example PLC technique for LC-SBC discussed above in Section A.2 under the same conditions. The performance of the example PLC technique is represented as "PLC." As shown in graph 1400, the performance of this particular PLC technique exceeds that of LC-SBC decoding when there are bit errors in either the first or second MSBs of the bits representing the lowest-frequency sub-band samples. Thus, another approach to mitigating the effect of bit errors in LC-SBC frames would be to detect whether the first or second MSBs of the bits representing the lowest-frequency sub-band samples are in error and then, if either of the first or second MSBs are in error, performing PLC. Otherwise, LC-SBC decoding is used. Of course, a different subset of the MSBs may be analyzed (e.g., the first MSB only, the first three MSBs, etc.) depending on the implementation.

2. Potential Approaches to Bit Error Management and/or Mitigation for Sub-Band Coding In view of the foregoing problem definition, several approaches to managing and/or mitigating the impact of bit errors on LC-SBC frames will now be described. Persons skilled in the relevant art(s) will appreciate that the approaches described herein are not limited to LC-SBC only and can also be generalized for application to other codecs. For example, the approaches may advantageously be applied to other codecs in which certain bits located in an encoded frame are known to be more sensitive to bit errors than others.

FIG. 15 depicts a table 1500 that shows the components of a header of an LC-SBC frame and the size of each component in bits. As shown in table 1500, the header includes an 8-bit cyclic redundancy check (CRC) code. As described in Appendix B of the A2DP specification, the 8-bit CRC code is generated using all the bits of the frame header, excluding the syncword and the CRC code itself, and all the bits used to represent the scale factors. Thus, the CRC code may be used by the LC-SBC decoder (or a receiver that includes an LC-SBC decoder) to detect errors in those fields.

As discussed above, the proper performance of bit allocation and extraction of sub-band samples by the LC-SBC decoder is premised on receiving the correct scale factors. If the scale factors are corrupted, the degradation of the quality of the speech signal generated by the LC-SBC decoder may be severe. Consequently, in one embodiment of the present invention, PLC is performed at the decoder if a check performed using the CRC code in the LC-SBC frame header indicates that the scale factors may be in error.

For Bluetooth® wideband speech applications, LC-SBC frames will be carried over Extended Synchronous Connection-Oriented (eSCO) links. The manner in which such an eSCO link may be established is specified as part of the Bluetooth® specification (a current version of which is entitled Bluetooth Specification Version 2.1+EDR, Jul. 26, 2007, published by the Bluetooth Special Interest Group). As described in the Bluetooth® specification, eSCO packets provide CRC bits that cover the payload data, which in a Bluetooth® wideband speech application will include LC-SBC frames. Consequently, the CRC code provided as part of an eSCO packet may also be used to determine whether there are bit errors in an LC-SBC frame.

Assume that an LC-SBC frame is received at an LC-SBC decoder and a check based on the CRC code included in the LC-SBC frame header indicates that there are no bit errors in the frame header or scale factors. Further assume that a check based on the CRC information included in the eSCO packet that carried the LC-SBC frame fails, thereby indicating that bit errors may be located elsewhere in the LC-SBC frame. In this case, one possible approach would be to use PLC to replace the LC-SBC frame. This approach may seem to be simple and make sense. However, as shown by a graph 1600 depicted in FIG. 16, this approach does not provide satisfactory results when the condition of the communication channel between the LC-SBC encoder and decoder is dominated by random bit-errors.

Figure 16:
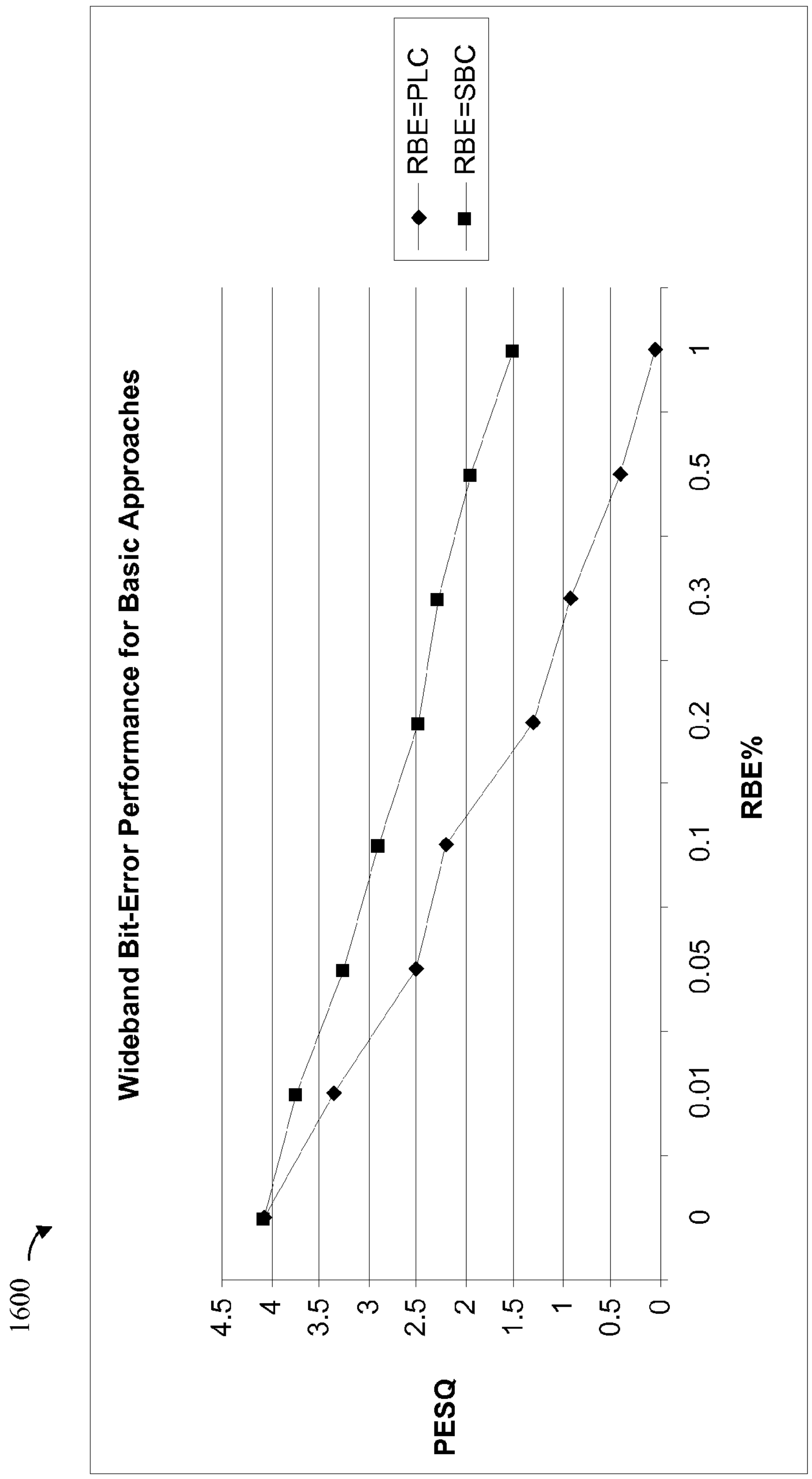
FIG. 16 is a graph that shows the quality of a speech signal generated by decoding an LC-SBC frame and by performing PLC as a function of a percentage of random bit errors introduced into a series of LC-SBC frames.

In particular, graph 1600 of FIG. 16 shows the quality of a speech signal generated by decoding an LC-SBC frame and by performing PLC as a function of the percentage of random bit errors introduced into a series of LC-SBC frames. The random bit errors were not introduced into the scale factors. The quality of the speech signal was measured using PESQ. The performance achieved by LC-SBC decoding is represented as "RBE-SBC" and the performance achieved by the PLC technique described above in Section A.2 is represented as "RBE-PLC." As shown by graph 1600 of FIG. 16, performing the PLC technique results in significantly worse performance than simply passing all the frames to the LC-SBC decoder in all cases.

Thus, alternate approaches should be considered. In accordance with one embodiment of the present invention, CRC or forward error correction (FEC) protection is provided for the first and second MSBs of the bits representing the lowest-frequency sub-band samples in an LC-SBC frame. As demonstrated in the preceding sub-section, the vast majority of the bit error sensitivity of an LC-SBC frame is located in the first two MSBs of the bits representing the lowest-frequency sub-band samples. It is noted that in other embodiments, a different subset of the MSBs may be protected (e.g., the first MSB only, the first three MSBs, etc.).

In a CRC-based approach, the CRC code that covers the first two MSBs could be used to check the integrity of those bits at the decoder. If the CRC check fails, then the LC-SBC frame is deemed lost and PLC is used to replace it. If the CRC check passes, then the LC-SBC frame can be decoded normally. In an FEC-based approach, the FEC information can be used to both detect and correct errors in the first two MSBs, such that the LC-SBC frame can be decoded normally. In either case, the resulting system would be very simple and provide excellent performance in the presence of random bit errors.

A method would need to be selected to pass the CRC or FEC information from the SBC encoder to the SBC decoder. In an embodiment in which 15 blocks are included in an LC-SBC frame, this would require CRC or FEC information covering 2 bits*15 blocks=30 bits of information. In one embodiment, the process that generates the 8-bit CRC code provided in the LC-SBC frame header could be adapted to also cover the additional bits. In another embodiment, bits from fields in the header of the LC-SBC frame that are deemed redundant or otherwise unnecessary could be replaced with CRC or FEC information that protects the 30 bits or to expand the existing CRC code to cover the additional 30 bits. In a still further embodiment, certain fields in the eSCO packet could be used to carry the CRC or FEC information.

Another approach to managing and/or mitigating the impact of bit errors on an LC-SBC frame involves examining characteristics associated with or generated during the demodulation of the radio frequency (RF) signal that carries the LC-SBC frame to determine or estimate the distribution, extent or location of bit errors in the LC-SBC frame. This information could then be used to determine when to apply PLC (or some other bit error mitigation technique) as opposed to LC-SBC decoding. For example, if this modem-assisted technique could provide bit-level reliability information then it could be used to determine if the two first MSBs used to represent the lowest-frequency sub-band samples are in error. As noted above, this information could then be used to render a decision regarding the application of PLC versus LC-SBC decoding.

In a further embodiment, as an alternative or in addition to using the foregoing modem-assisted technique, a bit error concealment technique that analyzes the encoded bit stream associated with the lowest-frequency sub-band could also be used to determine or estimate the distribution, extent or location of bit errors in the LC-SBC frame. This technique could compare a time domain representation of the signal in the lowest-frequency sub-band to a predicted version of the signal in order to detect bit errors. Since the signal in the lowest-frequency sub-band is simply a low-pass version of the speech signal, it will have speech-like characteristics (e.g., a pitch period) that can be exploited to implement this approach. A similar technique for CVSD coders is described in U.S. patent application Ser. No. 12/431,155, entitled "Bit Error Concealment for Audio Coding Systems" and filed on Apr. 28, 2009, except that the technique in that application operates on a full-band decoded speech signal.

A further technique that may be used to mitigate the impact of single bit errors on an LC-SBC frame is to use reflected binary codes, or so-called "gray codes," to implement the quantization tables used for quantizing the sub-band samples included in an LC-SBC frame. Currently, Appendix B of the A2DP specification does not provide for this, so some deviation from or modification of the standard would be required. As will be appreciated by persons skilled in the relevant art(s), the use of such gray codes will reduce the impact of single bit errors on the quantized sub-band samples by reducing the change in quantization level resulting from a single bit error.

3. Sub-Band Bit Error Concealment

A first particular bit error management technique for LC-SBC will now be described. The technique assumes that by one or more means (e.g., a CRC check, a modem-assisted technique, and/or analysis of the signal in the lowest-frequency sub-band) it can be determined with a high degree of likelihood that the first or second MSBs used to represent the lowest-frequency sub-band samples included in an LC-SBC frame contain errors.

In accordance with the technique, long-term and short-term prediction of the lowest-frequency sub-band signal is performed for the current frame of LC-SBC samples. The predicted value is then compared to that which is actually received. The error signal that results from the comparison is then compared to the expected error if a bit error occurs in the MSB(s). A bit is declared to be in error if the comparison is within some predefined bounds. The error can then be concealed by setting the bits to their most likely values. The predicted value can be used if the observed error does not correspond closely with the possible error values. In cases where the prediction is generally not performing well, the whole LC-SBC frame may be declared in error and PLC used to generate a replacement frame.

Figure 17:
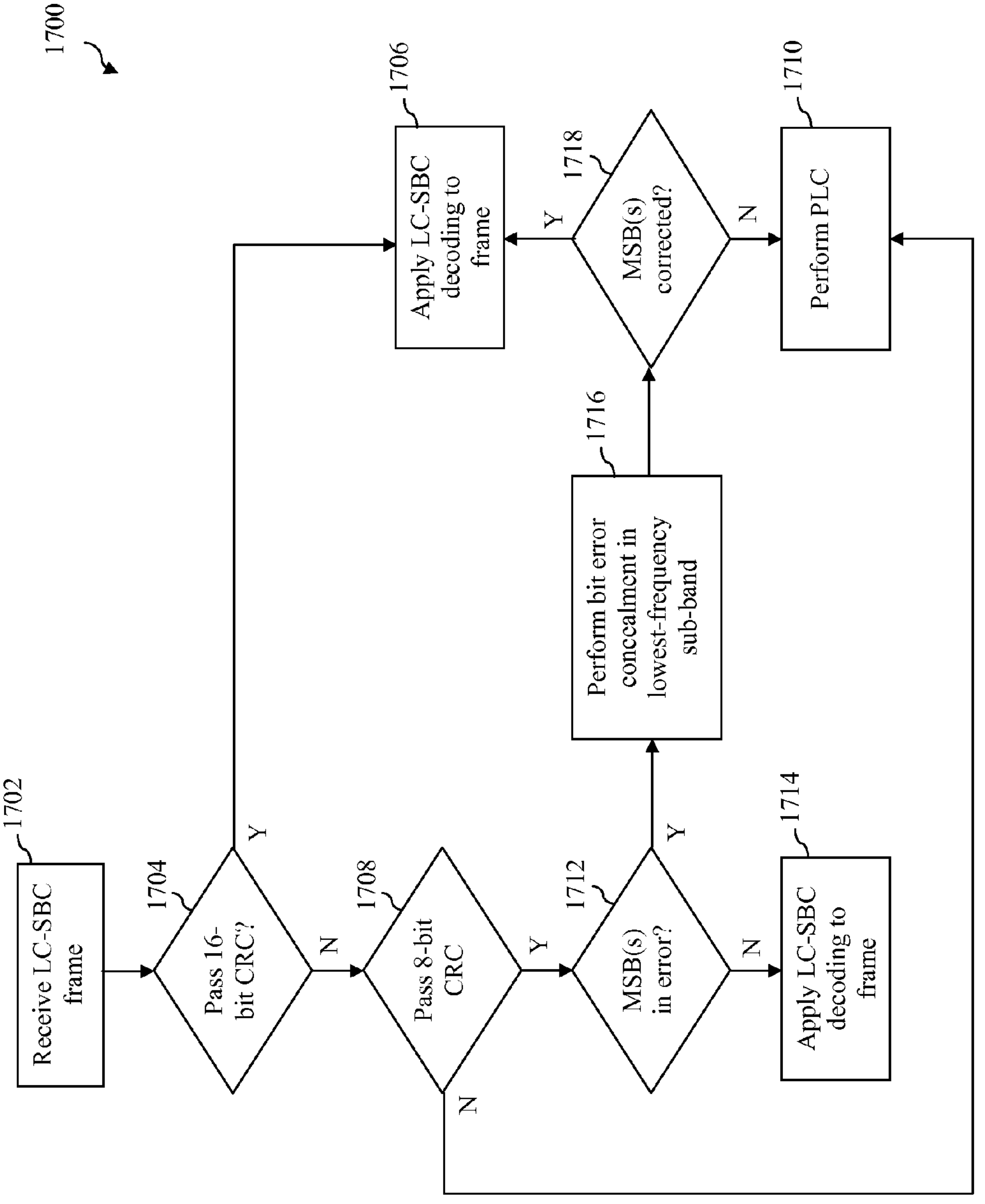
FIG. 17 depicts a flowchart of a bit error management technique for use with LC-SBC in accordance with one embodiment of the present invention.

FIG. 17 depicts a flowchart 1700 of an example method in accordance with this technique. As shown in FIG. 17, the method begins at step 1702, during which an audio frame encoded in accordance with LC-SBC is received (also referred to in the context of flowchart 1700 as an "LC-SBC frame."). The LC-SBC frame is received as part of a payload of an eSCO packet.

At decision step 1704, a CRC is performed based on a 16-bit CRC code included in the eSCO packet to determine if there are bit errors in the packet payload. If the 16-bit CRC passes, this indicates that there are no bit errors in the packet payload. Consequently, there will be no bit errors in the LC-SBC frame. In this case, LC-SBC decoding is applied to the LC-SBC frame to generate a corresponding frame of an output audio signal as shown at step 1706. Conversely, if the 16-bit CRC fails, this indicates that there are bit errors in the packet payload. Consequently, there may be bit errors in the LC-SBC frame. In this case, control flows to decision step 1708.

At decision step 1708, a CRC is performed based on the 8-bit CRC code included in the LS-SBC frame header (previously discussed in reference to table 1500 of FIG. 15) to determine if there are bit errors in certain header fields or in the encoded representation of the scale factors. If the 8-bit CRC fails, then this indicates that there are bit errors and that the scale factors may be corrupted. In this case, the degradation of the quality of the audio signal generated by the LC-SBC decoder may be severe and thus PLC is performed to generate a corresponding frame of the output audio signal as shown at step 1710. However, if the 8-bit CRC passes, then this indicates that there are no bit errors in the header fields or in the encoded representation of the scale factors and control flows to decision step 1712.

At decision step 1712, it is determined whether any of the first or second most significant bits (MSBs) used to represent the samples in the lowest-frequency sub-band in the LC-SBC frame are likely to be in error. As noted above, any of a wide variety of techniques may be used to determine whether any of the first and second MSBs are likely to be in error including performing a CRC check in an embodiment in which the first and second MSBs are protected by a CRC code, utilizing a modem-assisted technique for detecting bit errors during demodulation of an RF signal that carries the LC-SBC frame, and/or analyzing a signal comprising the lowest-frequency sub-band samples. Still other methods may be used.

If it is determined during decision step 1712 that none of the first and second MSBs are not likely to be in error, then normal LC-SBC decoding is applied to the LC-SBC frame to generate a frame of the output audio signal as shown at step 1714. Thus, even though it was determined during decision step 1704 that there may be bit errors in the LC-SBC frame, LC-SBC decoding is nevertheless applied to the LC-SBC frame. Such an approach may be adopted, for example, if it is determined that applying LC-SBC decoding to an LC-SBC frame with bit errors will generally provide better output audio signal quality than a particular PLC technique in instances where the encoded scale factors and first and second MSB(s) in the lowest-frequency sub-band are uncorrupted.

However, if it is determined during decision step 1712 that any of the first and second MSBs are likely to be in error, then control flows to step 1716. During step 1716, a bit error concealment (BEC) method for the lowest-frequency sub-band is performed to try and attempt to detect and correct the erroneous MSB(s). One example approach to performing the BEC in the lowest-frequency sub-band will be described below.

After step 1716 is performed, control flows to decision step 1718 during which it is determined whether the BEC process of step 1716 succeeded in detecting and correcting all of the erroneous first and second MSBs. If it is determined during decision step 1718 that the BEC process of step 1716 succeeded in detecting and correcting all of the erroneous first and second MSBs, then the corrected LC-SBC frame is passed to an LC-SBC decoder for decoding as shown at step 1706. This decoding step produces a corresponding frame of the output audio signal. However, if it is determined during decision step 1718 that the BEC process of step 1716 failed to detect and correct all of the erroneous first and second MSBs, then PLC is performed to generate a corresponding frame of the output audio signal as shown at step 1710.

Note that in an alternate embodiment, if it is determined at decision step 1708 that the 8-bit CRC passes, then control immediately flows to step 1716 during which the BEC method for the lowest-frequency sub-band is performed to try and attempt to detect and correct the erroneous MSB(s). In accordance with this embodiment, it is not necessary to determine whether any of the first or second MSBs used to represent the samples in the lowest-frequency sub-band are likely to be in error (as is done during decision step 1712). Although it is helpful to make such a determination in order to ensure that the BEC method is not applied unnecessarily, satisfactory results can also be achieved in accordance with this alternate embodiment.

In a further alternate embodiment, step 1710 involves performing PLC on the lowest-frequency sub-band signal while decoding the remaining sub-bands. The synthesized sub-band signal associated with the lowest-frequency sub-band can then be combined with the decoded sub-band signals from the remaining sub-bands to generate a frame of the output audio signal.

Figure 18:
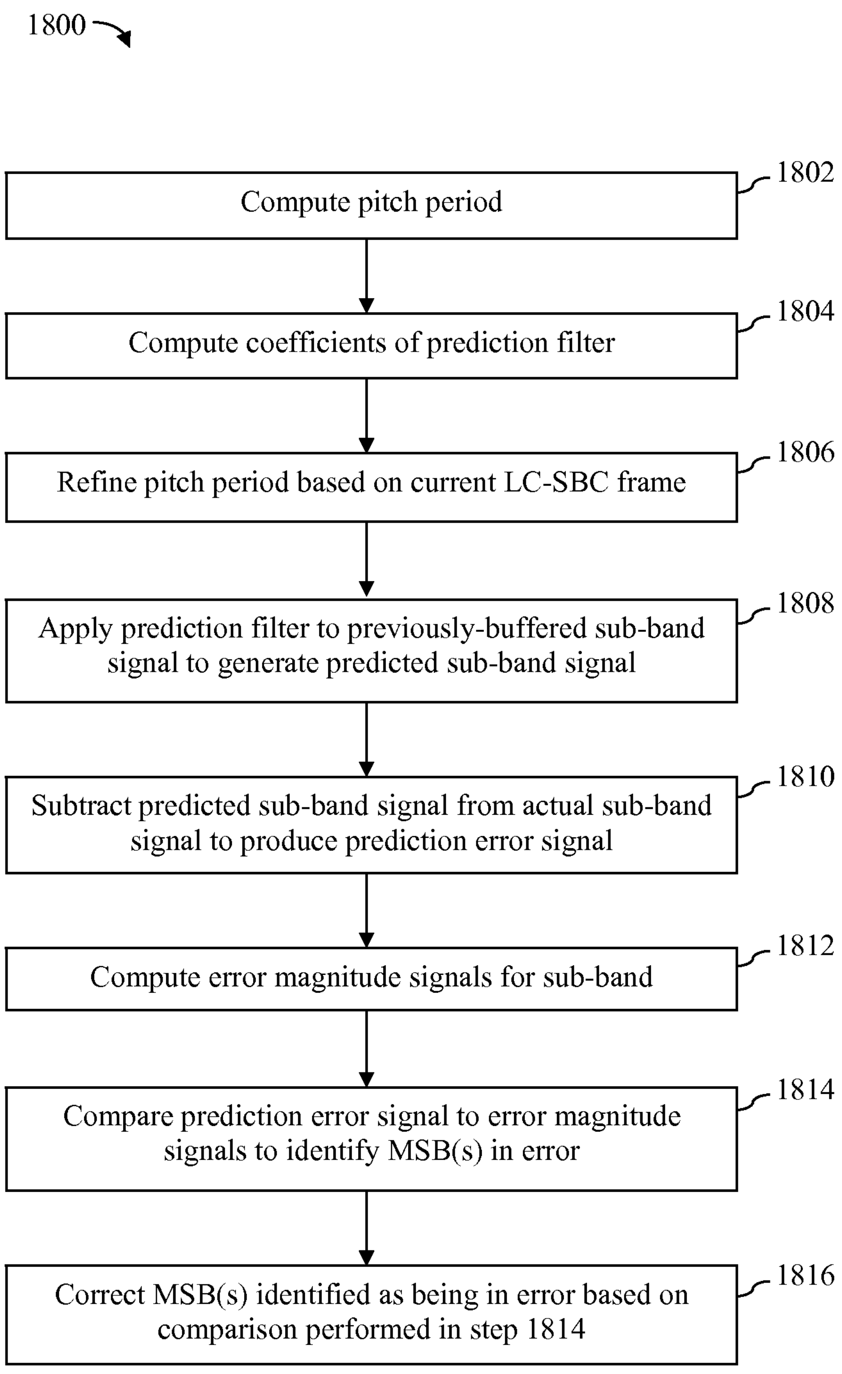
FIG. 18 depicts a flowchart of a method for detecting and correcting bit errors in bits used to represent the lowest-frequency sub-band samples in an LC-SBC frame in accordance with an embodiment of the present invention.

FIG. 18 depicts a flowchart 1800 of one example method for performing the sub-band BEC process of step 1716 mentioned above in reference to flowchart 1700. The method of flowchart 1800 may advantageously be used to detect and correct bit errors in the first and second MSBs used to represent the lowest-frequency sub-band samples in an LC-SBC frame. The method may be generalized to encompass additional MSBs. The method is described for an example implementation in which the full-band audio signal is sampled at 16 kHz.

As shown in FIG. 18, the method of flowchart 1800 begins at step 1802 in which a pitch period is computed for the lowest-frequency sub-band signal. Because the lowest-frequency sub-band signal is sampled at 2 kHz, it has reduced resolution. Thus, care must be taken in computing the pitch period. In one embodiment, the full-band output audio signal is used to calculate the pitch period at 16 kHz resolution. In accordance with such an embodiment, the increased resolution may facilitate the use of a single-tap pitch predictor for performing long-term prediction of the lowest-frequency sub-band signal.

At step 1804, coefficients of a prediction filter for the lowest-frequency sub-band are computed based on a previously-buffered portion of the lowest-frequency sub-band signal. The prediction coefficients may be denoted $h_k$. In one embodiment, data associated with the current LC-SBC frame is not included in the calculations since such data may contain errors.

Depending upon the implementation, short-term prediction may be performed in the 2 kHz domain or in the upsampled domain. Upsampling may not be beneficial since upsampling just uses the original 2 kHz samples. If the prediction is of the same order as the upsampling filter, this likely provides no benefit. Consequently, performing the short-term prediction in the 2 kHz domain will likely provide equivalent quality at the lowest complexity. In accordance with such an approach, correlation computations may be performed on the 2 kHz sub-band signal.

Assuming that short-term prediction is performed in the 2 kHz domain and the pitch period is computed in the 16 kHz domain as discussed above, it must then be determined how to combine the short-term prediction with the long-term prediction. In one embodiment, the long-term correlations are computed on a 2 kHz signal, but the original 2 kHz sub-band signal is re-sampled at the fraction specified by the higher resolution pitch. Hence, in the correlation computation, the signal $x(n-kp)$ is needed, wherein kp is the pitch period obtained at 16 kHz resolution divided by 8. If kp is an integer, then no re-sampling is required. However, if kp contains a fractional component, then between the two samples that cover $x(n-kp)$, the 2 kHz signal is re-sampled to obtain the finer resolution sample required. For example, if kp=100.125, the ⅛ sample between each original 2 kHz sample $x(n-101)$ and $x(n-100)$ is computed. This re-sampled signal is then used to compute the necessary correlations.

As is well-known to persons skilled in the art, both correlation and covariance methods may be used to calculate the prediction filter coefficients. Due to the 2 kHz sampling rate, limited samples are available to perform these methods. The correlation method throws out samples in computing a biased estimate. To avoid this, one embodiment utilizes the covariance method instead. Since correlations are performed at the 2 kHz sampling rate, the complexity is not very high and thus the added computation associated with the covariance method is not that significant. In addition, if a 1-tap long-term prediction filter and a two-sided first order short-term prediction filter is used, this results in a third-order equation to solve which is relatively low complexity no matter if the matrix is Toeplitz symmetrical or not.

In the so-called covariance method, the means squared prediction error is minimized where the error is given by:

$$\varepsilon^2 = \sum_{n=n_0}^{n_0+N-1} \left[x(n) - \sum_k h_k \cdot x(n-k)\right]^2. \tag{7}$$

This leads to the set of equations:

$$\sum_k \varphi_{xx}(j,k) \cdot h_k = \varphi_{xx}(j,0) \tag{8}$$

where $$\varphi_{xx}(j,k) = \sum_{n=n_0}^{n_0+N-1} x(n-j) \cdot x(n-k) \tag{9}$$

and for j, k equal to the lags used in the prediction.

Now, for j, k=1, −1, kp, we get:

$$\begin{bmatrix} \phi_{xx}(1,1) & \phi_{xx}(1,-1) & \phi_{xx}(1,k_p) \\ \phi_{xx}(-1,1) & \phi_{xx}(-1,-1) & \phi_{xx}(-1,k_p) \\ \phi_{xx}(k_p,1) & \phi_{xx}(k_p,-1) & \phi_{xx}(k_p,k_p) \end{bmatrix} \begin{bmatrix} h_1 \\ h_{-1} \\ h_{k_p} \end{bmatrix} = \begin{bmatrix} \phi_{xx}(1,0) \\ \phi_{xx}(-1,0) \\ \phi_{xx}(k_p,0) \end{bmatrix} \tag{10}$$

At step 1806, the pitch period is refined based on the current LC-SBC frame. This step can advantageously improve the quality of the long-term prediction in instances where the current LC-SBC frame with bit errors still retains enough uncorrupted data that it can be used to derive a more accurate pitch for the current frame.

At step 1808, the prediction filter having coefficients $h_k$ computed during step 1804 is applied to a previously-buffered portion of the lowest-frequency sub-band signal to generate a predicted sub-band signal. In one particular embodiment, this step involves computing:

$$\hat{x}(n) = \sum_k h_k \cdot x(n-k) \quad k = 1, -1, kp \tag{11}$$

wherein x(n) comprises the original sub-band signal, $\hat{x}$(n) comprises the predicted sub-band signal, and kp comprises the pitch period determined in a manner set forth above. This particular embodiment utilizes a 1-tap long-term prediction filter and a two-sided first order short-term prediction filter. However, persons skilled in the relevant art(s) will appreciate that other prediction filters may be used to perform this step.

At step 1810, the predicted sub-band signal obtained during step 1808 is subtracted from the actual lowest-frequency sub-band signal received for the current LC-SBC frame to produce a prediction error signal. In one particular embodiment, this step involves computing:

$$e(n) = x(n) - \hat{x}(n) \tag{12}$$

wherein x(n) comprises the original sub-band signal, $\hat{x}$(n) comprises the predicted sub-band signal, and e(n) comprises the prediction error signal. The lowest-frequency sub-band signal can be determined for the current LC-SBC frame based on applying decoding operations to the received bit stream in a manner previously described.

At step 1812, error magnitude signals are computed for the lowest-frequency sub-band of the current LC-SBC frame. In one embodiment, this step comprises computing an error magnitude signal for the first MSB, the second MSB, and both the first and second MSBs used to represent the lowest-frequency sub-band. The error magnitude signal for the first MSB may be calculated by computing the difference between the lowest-frequency sub-band signal received for the current LC-SBC frame and a version of the same signal that is obtained by flipping the first MSB for each signal sample. The error magnitude signal for the second MSB may be calculated by computing the difference between the lowest-frequency sub-band signal received for the current LC-SBC frame and a version of the same signal that is obtained by flipping the second MSB for each signal sample. The error magnitude signal for the first and second MSBs may be calculated by computing the difference between the lowest-frequency sub-band signal received for the current LC-SBC frame and a version of the same signal that is obtained by flipping both the first and second MSBs for each signal sample.

At step 1814, the prediction error signal obtained during step 1810 is compared to each of the error magnitude signals obtained during step 1812 on a sample-by-sample basis. This step may involve determining if the magnitude of a difference between the amplitude of a sample of the prediction error signal and the amplitude of a corresponding sample of each of the error magnitude signals is less than a predefined value. If the magnitude of the difference between the amplitude of the sample of the prediction error signal and the amplitude of a corresponding sample of a particular error magnitude signal is less than the predefined value, then this can be interpreted as meaning that an MSB associated with the particular error magnitude signal is in error for a corresponding sample of the actual sub-band signal.

Figure 19:
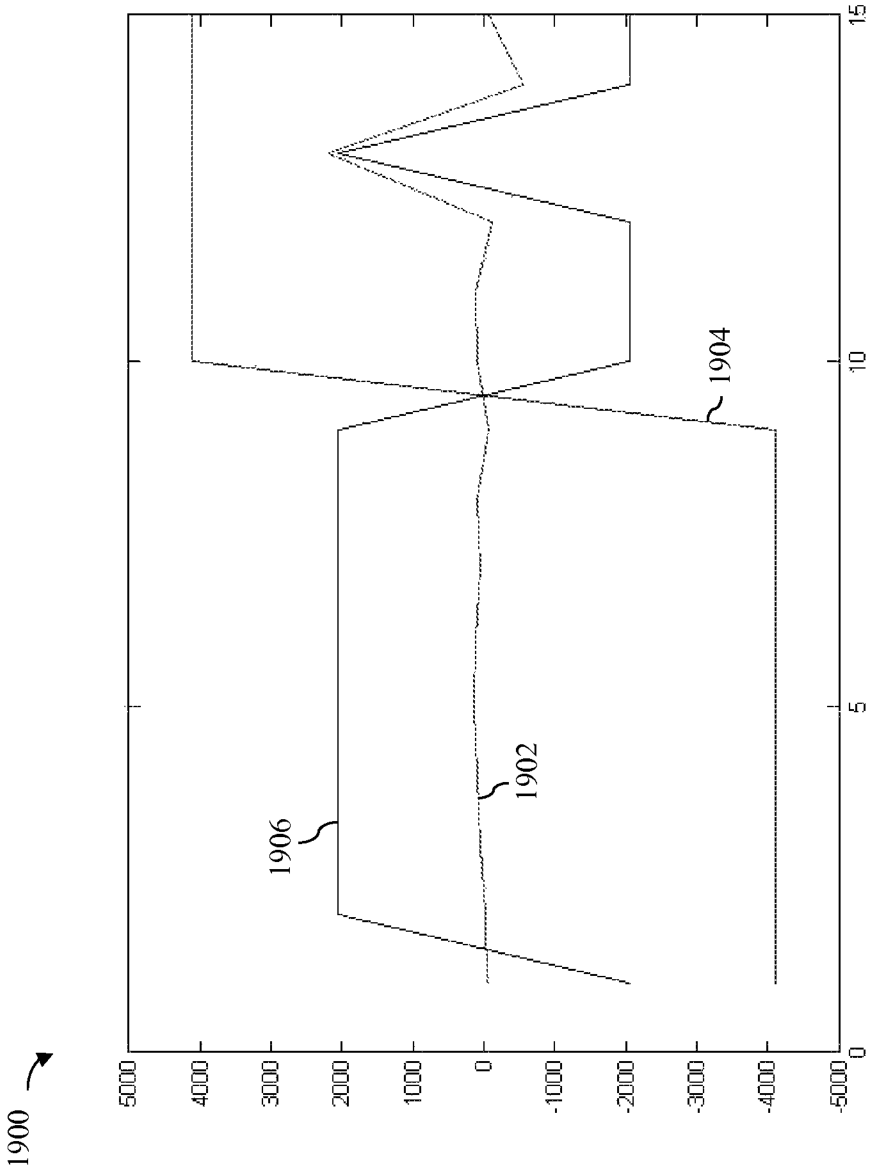
FIG. 19 is a signal plot that shows a prediction error signal and two error magnitude signals associated with a lowest-frequency sub-band signal of an LC-SBC frame.

This step will now be further illustrated with reference to FIG. 19. FIG. 19 depicts a signal plot 1900 that shows a prediction error signal 1902 corresponding to the lowest-frequency sub-band signal of a current LC-SBC frame. Prediction error signal 1902 may be obtained in the manner described above in reference to step 1810—namely, by obtaining the difference between the actual lowest-frequency sub-band signal and the predicted lowest-frequency sub-band signal for the current LC-SBC frame. In this particular example, the lowest-frequency sub-band signal comprises 16 samples (corresponding to an LC-SBC configuration with a block size of 16) and thus the prediction error signal also comprises 16 samples. Signal plot 1900 shows the amplitude of each of the 16 samples in the prediction error signal.

Signal plot 1900 also shows a first error magnitude signal 1904 obtained by computing the difference between the lowest-frequency sub-band signal for the current LC-SBC frame and a version of the same signal that is obtained by flipping the first MSB for each signal sample. Graph 1900 further shows a second error magnitude signal 1906 obtained by computing the difference between the lowest-frequency sub-band signal for the current LC-SBC frame and a version of the same signal that is obtained by flipping the second MSB for each signal sample. Like the lowest-frequency sub-band signal itself, each of these error magnitude signals comprises 16 samples.

As shown in FIG. 19, the amplitude of prediction error signal 1902 can be compared to the amplitude of first error magnitude signal 1904 and the amplitude of second error magnitude signal 1906 on a sample-by-sample basis. Where the amplitude of a sample of prediction error signal 1902 is very close to that of a corresponding sample of first error magnitude signal 1904 or a corresponding sample of second error magnitude signal 1906, a bit error may be declared and then corrected. For example, as shown in graph 1900, the amplitude of sample 13 of prediction error signal 1902 is very close to the amplitude of sample 13 of second error magnitude signal 1906. Thus, it may be determined that the second MSB is in error in the encoded representation of sample 13 of the lowest-frequency sub-band. This bit can then be corrected. Note that the minimum distance between samples required for declaring a bit error can be controlled, for example, by adjusting the value of a configurable parameter that specifies such a minimum distance.

Note that in an alternate implementation, rather than comparing the prediction error signal obtained during step 1810 to each of the error magnitude signals obtained during step 1812 on a sample-by-sample basis, only a subset of the samples of the prediction error signal are compared to corresponding samples of the error magnitude signals to reduce the number of computations that must be performed to detect bit errors. For example, in one embodiment, only the sample of the prediction error signal having the largest magnitude is compared to corresponding samples of the error magnitude signals. In a further embodiment, only the sample of the prediction error signal having the largest magnitude and one or more samples immediately before or after that sample (e.g., in a predefined window) are compared to corresponding samples of the error magnitude signals.

Returning now to the description of flowchart 1800, at step 1816, the MSB(s) identified as being in error by virtue of the comparison performed in step 1814 are corrected. This step may involve for example, changing the value of the first and/or second MSB used to represent one or more sub-band samples in the lowest frequency sub-band of the current LC-SBC frame from a “0” to a “1” or from a “1” to a “0.”

It is possible that in some instances, no erroneous MSBs may be identified for an LC-SBC frame using the foregoing method. For example, the comparison performed in step 1824 may not identify any error magnitude and prediction error samples that are sufficiently close to declare an error. In such a case, the bit error detection and correction process of flowchart 1800 may be deemed to have failed for the current LC-SBC frame and PLC may be invoked to generate a corresponding frame of an output audio signal. In an alternative embodiment, if a sample of the prediction error signal suggests that a particular sample of the lowest-frequency sub-band is in error but the corresponding samples of the error magnitude signals are not sufficiently close to declare an error, the predicted value of the sub-band sample in the predicted sub-band signal $\hat{x}(n)$ can simply be used to replace the suspect sub-band sample.

Note that in certain embodiments, during certain frames or portions of the audio signal when prediction of the lowest-frequency sub-band signal is not performing well, the LC-SBC frame may simply be declared in error and PLC may be used to generate a replacement frame.

Figure 20:
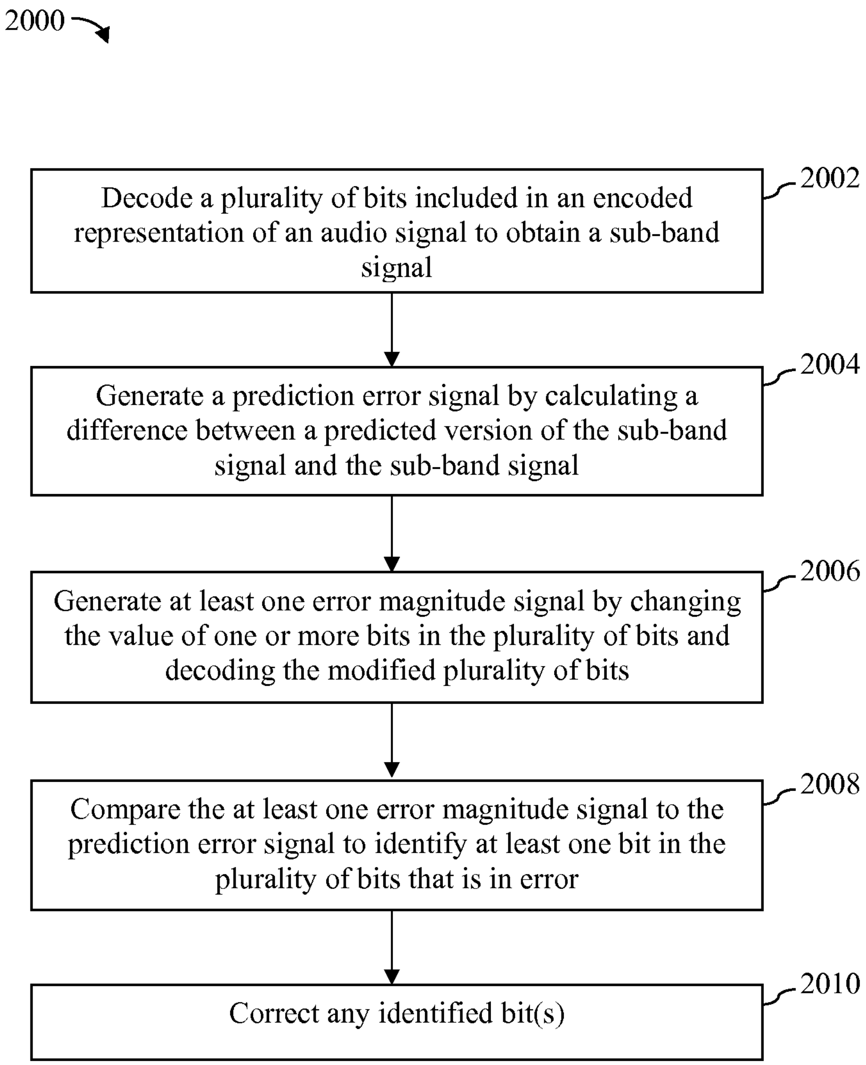
FIG. 20 depicts a flowchart of a generalized method for performing sub-band bit error concealment in accordance with an embodiment of the present invention.

FIG. 20 depicts a flowchart 2000 of a more generalized version of the sub-band bit error concealment process described above in reference to FIG. 19. Flowchart 2000 is intended to demonstrate, among other things, that the process is not limited to LC-SBC decoding.

As shown in FIG. 20, the method of flowchart 2000 begins at step 2002 in which a plurality of bits included in an encoded representation of an audio signal is decoded to obtain a sub-band signal.

At step 2004, a prediction error signal is generated by calculating a difference between a predicted version of the sub-band signal and the sub-band signal.

At step 2006, at least one error magnitude signal is generated by changing the value of one or more bits in the plurality of bits and then decoding the modified plurality of bits.

At step 2008, the at least one error magnitude signal is compared to the prediction error signal to identify at least one bit in the plurality of bits that is in error.

At step 2010, any bit(s) identified during step 2008 is corrected.

As will be appreciated by persons skilled in the relevant art(s), each of the steps of flowcharts 1700, 1800 and 2000 described above in reference to FIGS. 17, 18 and 20, respectively, may be performed by hardware, such as by appropriately designed analog and/or digital circuits, by software, through the execution of appropriate instructions by one or more general purpose or special-purpose processors, or by a combination of appropriately-configured hardware and software. In one embodiment, a separate software or hardware module is implemented that performs the function described in each step of each flowchart. Thus, these flowcharts 1700, 1800 and 2000 may also be viewed as describing modules that perform particular functions.

4. Header Bit Error Concealment (BEC) Based Approaches

One approach to bit error management involves performing a CRC based on the 8-bit CRC code included in the header of an LC-SBC frame and performing PLC instead of decoding if the CRC fails. The 8-bit CRC code covers 16 bits of the LC-SBC frame header (all header bits except the sync word and the CRC code itself) and 32 bits that represent the scale factors. The problem with this approach is that if the bit errors detected by the failure of the 8-bit CRC are mainly single bit errors in the header bits, this will result in otherwise good LC-SBC frames being thrown out and a substantial increase in the packet loss rate.

A series of related bit error management techniques for LC-SBC will now be described that address this issue. Each of the techniques involves performing a process that will be referred to herein as “header bit error concealment (BEC).” In accordance with “header BEC,” a CRC is performed based on the 8-bit CRC code in the header of a received LC-SBC frame. If the CRC passes, then the LC-SBC frame is left unmodified. However, if the CRC fails, then each bit covered by the 8-bit CRC code is individually flipped and the CRC is performed again. Since the 8-bit CRC code covers 48 bits as noted above, this means potentially flipping each one of the 48 bits and performing 48 corresponding CRCs after a single bit has been flipped. If changing the value of a particular one of the 48 bits results in passing the CRC, then it is assumed that a bit error has been found and the bit in error is corrected (i.e., changed from a “1” to a “0” or from a “0” to a “1.”). This method is capable of detecting and correcting individual bit errors only.

Figure 21:
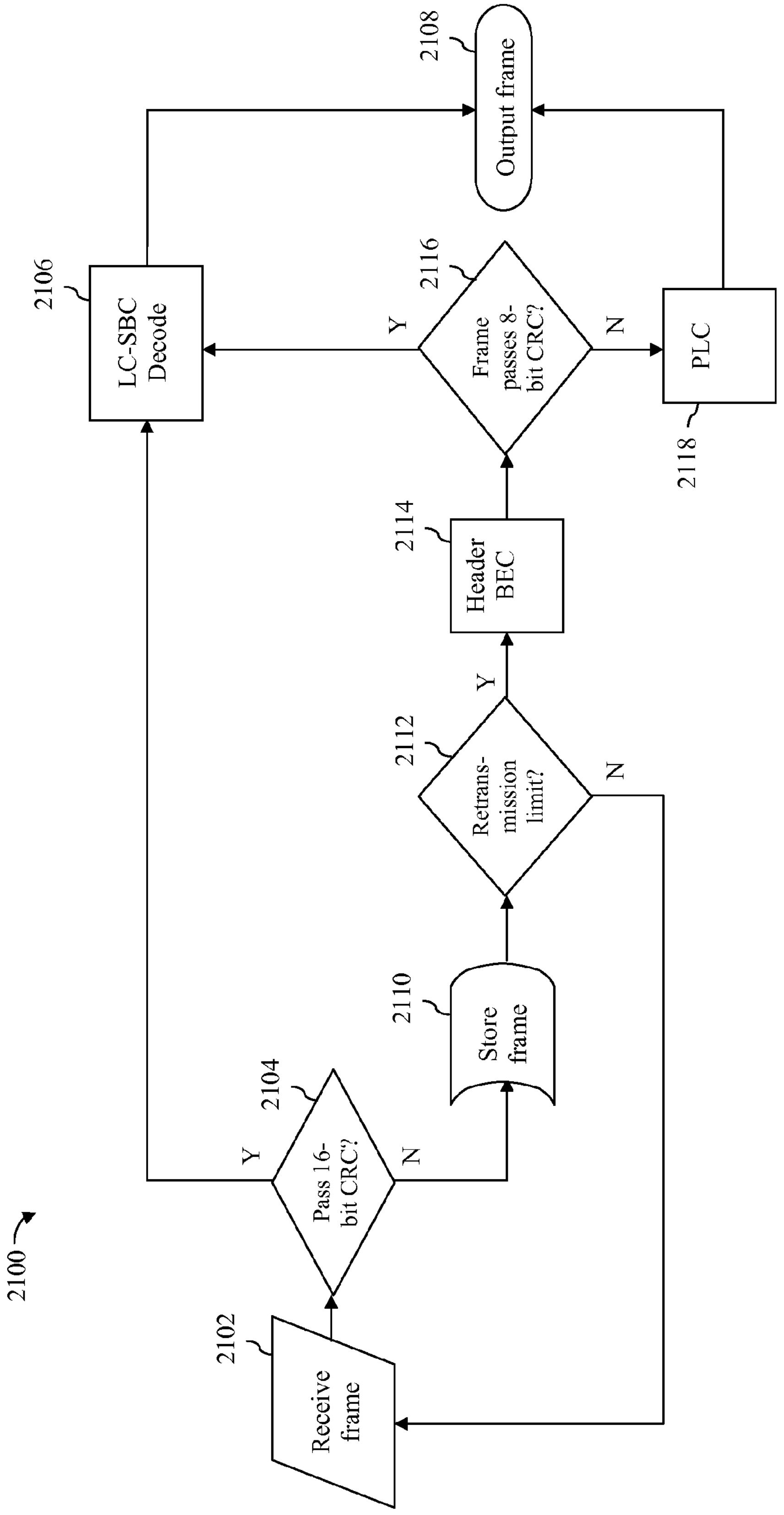
FIG. 21 depicts a flowchart of a first bit error management method that utilizes a header bit error concealment (BEC) technique in accordance with an embodiment of the present invention.

FIG. 21 depicts a flowchart 2100 of a first bit error management method that utilizes header BEC in accordance with an embodiment of the present invention. This embodiment may be utilized when only a single copy of a particular LC-SBC frame is available. As will be appreciated by persons skilled in the relevant art(s), Bluetooth® eSCO links can be configured to allow retransmission of eSCO packets which means that Bluetooth® devices can obtain multiple copies of the same LC-SBC frame. However, only a single copy may be available if the eSCO link that carried the LC-SBC frame is configured for zero retransmissions or if only one transmitted frame is successfully recovered from the eSCO link.

As shown in FIG. 21, the method of flowchart 2100 begins at step 2102 in which an LC-SBC frame is received. It is assumed that the LC-SBC frame is received as part of the payload of an eSCO packet.

At decision step 2104, a CRC is performed based on a 16-bit CRC code included in the eSCO packet to determine if there are bit errors in the packet payload. If the 16-bit CRC passes, this indicates that there are no bit errors in the packet payload. Consequently, there will be no bit errors in the LC-SBC frame. In this case, LC-SBC decoding is applied to the LC-SBC frame to generate a corresponding frame of an output audio signal as shown at step 2106. The generated frame is then output at step 2108.

Conversely, if the 16-bit CRC fails during decision step 2104, this indicates that there are bit errors in the packet payload. Consequently, there may be bit errors in the LC-SBC frame. In this case, control flows to step 2110, in which the LC-SBC frame is stored in a buffer or other suitable memory device or structure. Control then flows to decision step 2112.

During decision step 2112, it is determined whether or not a retransmission limit associated with a link over which the eSCO packet was transmitted has been met. If the limit has not been met, then a retransmission of the eSCO packet is requested. Otherwise, control flows to step 2114. As noted above, in accordance with the method of flowchart 2100, it is assumed that either (a) the retransmission limit is 0, such that decision step 2112 will always determine that the retransmission limit has been met and control will always flow to step 2114; or (b) the retransmission limit is greater than 0, but all but one transmission fails such that only a single copy of the LC-SBC frame will be available when the retransmission limit is met.

At step 2114, header BEC is applied to the LC-SBC frame. As discussed above, this process will either (a) provide an unmodified version of the LC-SBC frame if the LC-SBC frame passes a CRC based on the 8-bit CRC code in the LC-SBC frame header, (b) produce a modified LC-SBC frame that passes the 8-bit CRC based on the correction of a single detected bit error, or (c) provide an unmodified version of the LC-SBC frame that fails the 8-bit CRC.

At decision step 2116, it is determined whether the application of the header BEC process resulted in the provision of an LC-SBC frame that passes the 8-bit CRC. If the LC-SBC frame provided by the application of the header BEC process passes the 8-bit CRC then LC-SBC decoding is applied to the LC-SBC frame to generate a corresponding frame of the output audio signal as shown at step 2106. However, if the LC-SBC frame provided by the application of the header BEC process fails the 8-bit CRC, then PLC is utilized to generate a corresponding frame of the output audio signal as shown at step 2118. In either case, the generated frame is then output at step 2108.

Figure 22:
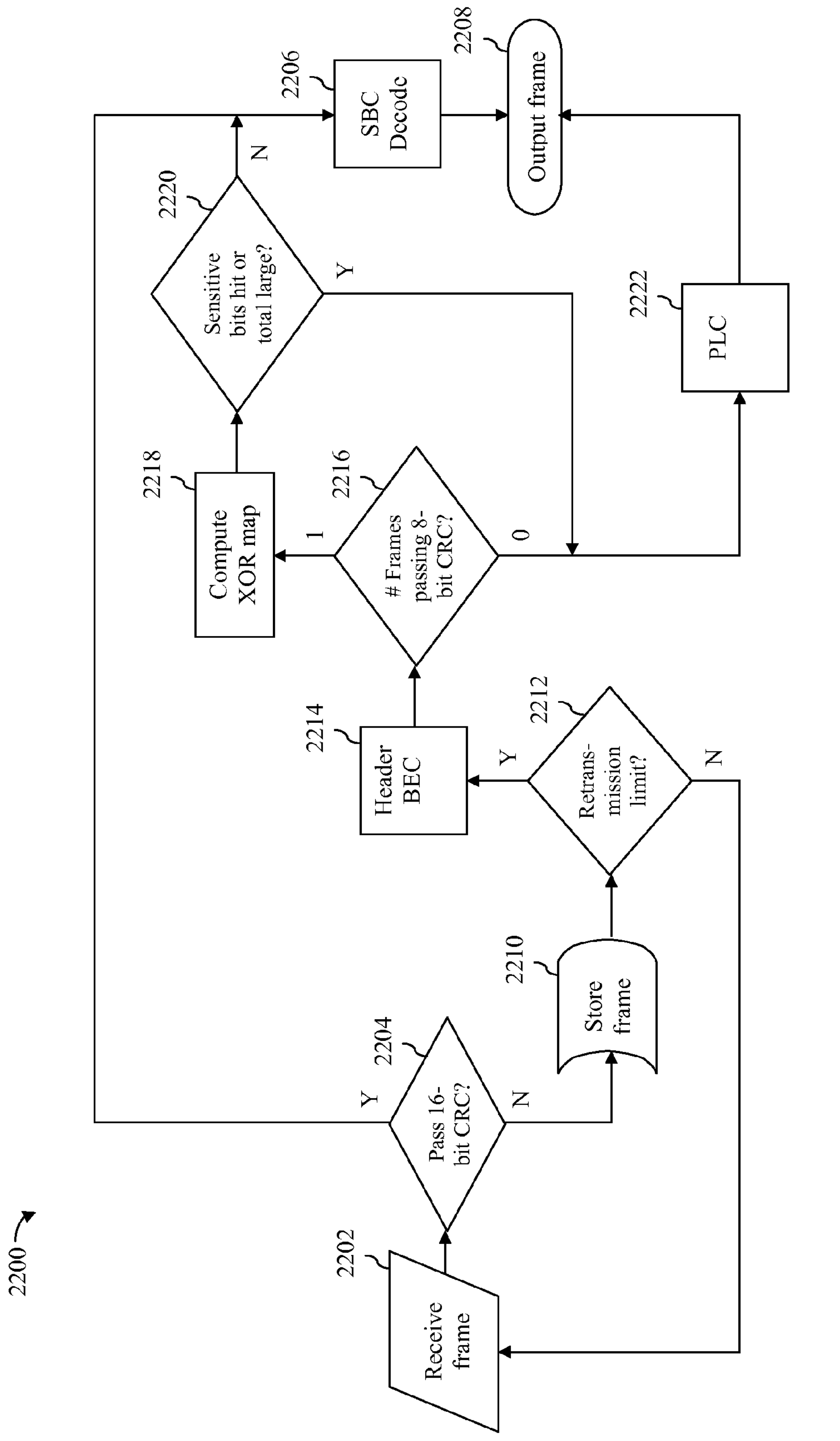
FIG. 22 depicts a flowchart of a second bit error management method that utilizes a header BEC technique in accordance with an embodiment of the present invention.

FIG. 22 depicts a flowchart 2200 of a second bit error management method that utilizes header BEC in accordance with an embodiment of the present invention. This embodiment may be utilized when two copies of a particular LC-SBC frame are available.

As shown in FIG. 22, the method of flowchart 2200 begins at step 2202 in which an LC-SBC frame is received. It is assumed that the LC-SBC frame is received as part of the payload of an eSCO packet.

At decision step 2204, a CRC is performed based on a 16-bit CRC code included in the eSCO packet to determine if there are bit errors in the packet payload. If the 16-bit CRC passes, this indicates that there are no bit errors in the packet payload. Consequently, there will be no bit errors in the LC-SBC frame. In this case, LC-SBC decoding is applied to the LC-SBC frame to generate a corresponding frame of an output audio signal as shown at step 2206. The generated frame is then output at step 2208.

Conversely, if the 16-bit CRC fails during decision step 2204, this indicates that there are bit errors in the packet payload. Consequently, there may be bit errors in the LC-SBC frame. In this case, control flows to step 2210, in which the LC-SBC frame is stored in a buffer or other suitable memory device or structure. Control then flows to decision step 2212.

During decision step 2212, it is determined whether or not a retransmission limit associated with a link over which the eSCO packet was transmitted has been met. If the limit has not been met, then a retransmission of the eSCO packet is requested. Otherwise, control flows to step 2214. As noted above, in accordance with the method of flowchart 2200, it is assumed that two copies of an eSCO packet have been retrieved. Two copies may be retrieved either because the retransmission limit is 1 or because the retransmission limit is greater than 1, but all but 2 transmissions fail. In any case, if either copy passes the 16-bit CRC check of decision step 2204, then normal LC-SBC decoding will be applied. However, if both fail the 16-bit CRC check, then both will be stored in memory in accordance with step 2210 and when the retransmission limit is met at decision step 2212, control will flow to step 2214.

At step 2214, header BEC is applied to a first of the two copies of the LC-SBC frame. As discussed above, this process will either (a) provide an unmodified version of the LC-SBC frame if the LC-SBC frame passes a CRC based on the 8-bit CRC code in the LC-SBC frame header, (b) produce a modified version of the LC-SBC frame that passes the 8-bit CRC based on the correction of a single detected bit error, or (c) provide an unmodified version of the LC-SBC frame that fails the 8-bit CRC.

If during step 2214 the application of header BEC to the first of the two copies of the LC-SBC frame does not provide a version of the LC-SBC frame that passes the 8-bit CRC, then header BEC will be applied to the second of the two copies of the LC-SBC frame. If the application of header BEC to the second of the two copies of the LC-SBC frame also does not provide a version of the LC-SBC frame that passes the 8-bit CRC then control flows to step 2222, during which PLC is utilized to generate a corresponding frame of the output audio signal. The generated frame is then output at step 2208.

However, if during step 2214, at least one version of the LC-SBC frame is obtained that passes the 8-bit CRC, then an exclusive or (XOR) is computed between the passing version and the other (passing or non-passing) version to obtain a map of bit differences between the two versions of the LC-SBC frames. This is shown at step 2218. This XOR map can be used to determine an estimate of a total number of bit errors in the LC-SBC frame as well as to obtain an indication of which bits may be in error.

At decision step 2220, it is determined based on the XOR map whether certain sensitive bits in the LC-SBC frame may be in error or whether the estimated number of bit errors is too large. Determining whether sensitive bits in the LC-SBC frame may be in error may comprise, for example and without limitation, determining whether any of the first or second MSBs used to represent the samples in the lowest-frequency sub-band may be in error. Determining whether the estimated number of bit errors is too large may comprise, for example, determining whether the estimated number of bit errors exceeds some predetermined threshold.

If it is determined during decision step 2220 that sensitive bits in the LC-SBC frame may be in error or that the estimated number of bit errors is too large then PLC is utilized to generate a corresponding frame of the output audio signal as shown at step 2222. However, if it is determined during decision step 2220 that the sensitive bits in the LC-SBC frame are not in error and that the estimated number of bit errors is not too large then LC-SBC decoding is applied to a version of the LC-SBC frame that passed the 8-bit CRC (produced during step 2214 as previously described) to generate a corresponding frame of the output audio signal as shown at step 2206. In either case, the generated frame is then output at step 2208.

Figure 23:
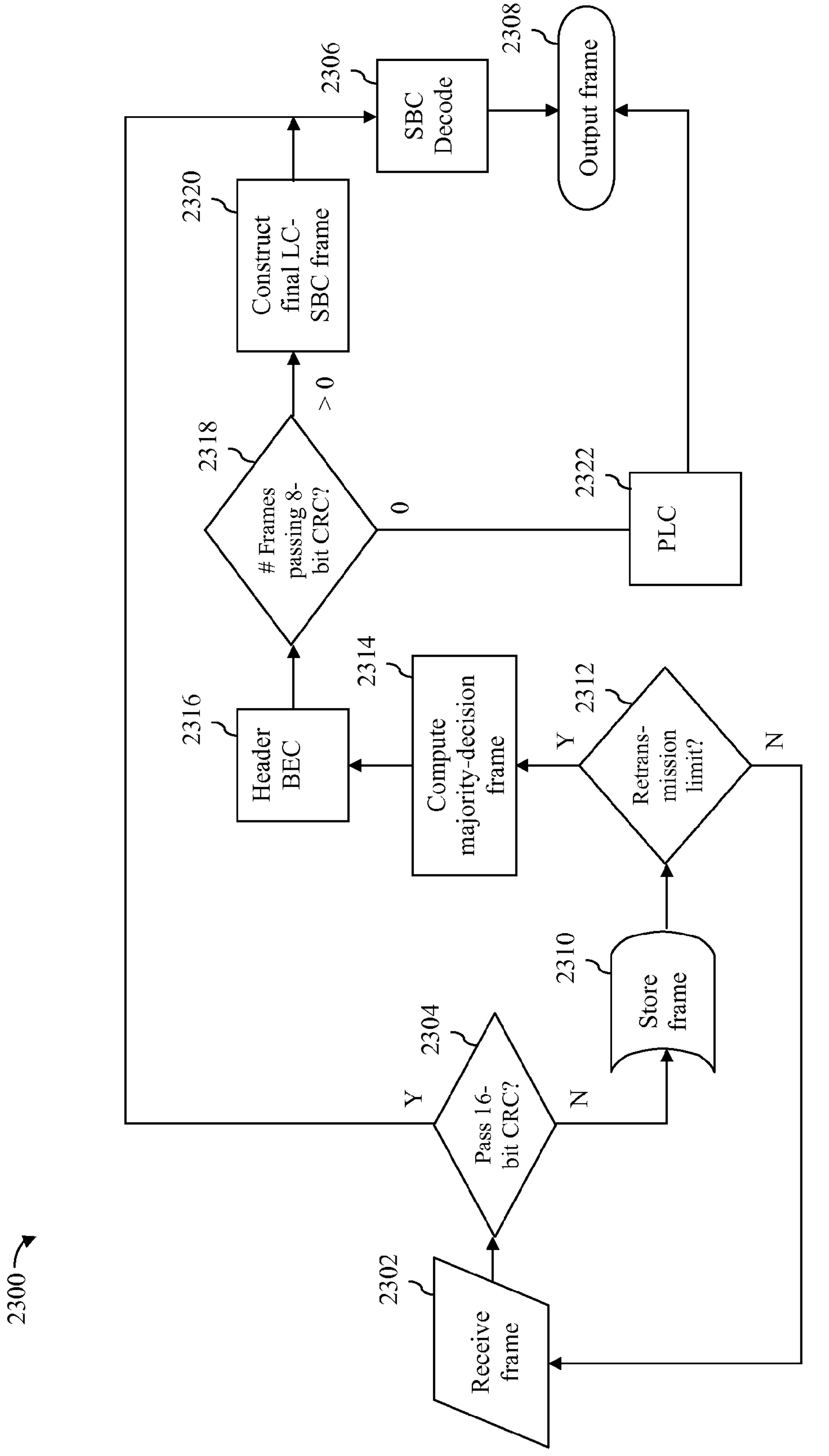
FIG. 23 depicts a flowchart of a third bit error management method that utilizes a header BEC technique in accordance with an embodiment of the present invention.

FIG. 23 depicts a flowchart 2300 of a third bit error management method that utilizes header BEC in accordance with an embodiment of the present invention. This embodiment may be utilized when three copies of a particular LC-SBC frame are available.

As shown in FIG. 23, the method of flowchart 2300 begins at step 2302 in which an LC-SBC frame is received. It is assumed that the LC-SBC frame is received as part of the payload of an eSCO packet.

At decision step 2304, a CRC is performed based on a 16-bit CRC code included in the eSCO packet to determine if there are bit errors in the packet payload. If the 16-bit CRC passes, this indicates that there are no bit errors in the packet payload. Consequently, there will be no bit errors in the LC-SBC frame. In this case, LC-SBC decoding is applied to the LC-SBC frame to generate a corresponding frame of an output audio signal as shown at step 2306. The generated frame is then output at step 2308.

Conversely, if the 16-bit CRC fails during decision step 2304, this indicates that there are bit errors in the packet payload. Consequently, there may be bit errors in the LC-SBC frame. In this case, control flows to step 2310, in which the LC-SBC frame is stored in a buffer or other suitable memory device or structure. Control then flows to decision step 2312.

During decision step 2312, it is determined whether or not a retransmission limit associated with a link over which the eSCO packet was transmitted has been met. If the limit has not been met, then a retransmission of the eSCO packet is requested. Otherwise, control flows to step 2314. As noted above, in accordance with the method of flowchart 2300, it is assumed that three copies of an eSCO packet have been retrieved. Three copies may be retrieved either because the retransmission limit is 2 or because the retransmission limit is greater than 2, but all but 3 transmissions fail. In any case, if any one of the three copies passes the 16-bit CRC check of decision step 2304, then normal LC-SBC decoding will be applied. However, if all three copies fail the 16-bit CRC check, then all three copies will be stored in memory in accordance with step 2310 and when the retransmission limit is met at decision step 2312, control will flow to step 2314.

At step 2314, the three copies of the LC-SBC frame are utilized to create a fourth copy of the LC-SBC frame referred to herein as the majority-decision LC-SBC frame. In accordance with this process, for each bit location in the majority-decision LC-SBC frame, the value of a corresponding bit in that location is obtained from each of the three copies. If the values are identical across all three copies, then that value is used in the same bit location for the majority-decision LC-SBC frame. However, if the values are not identical across all three copies, then the value appearing in two out of three copies is used in the same bit location for the majority-decision LC-SBC frame.

At step 2316, header BEC is applied to the three copies of the LC-SBC frame as well as to the majority-decision LC-SBC frame to obtain at least one version of the LC-SBC frame that passes the 8-bit CRC. At shown at decision step 2318, if no version of the LC-SBC frame passes the 8-bit CRC then control flows to step 2322, during which PLC is utilized to generate a corresponding frame of the output audio signal. The generated frame is then output at step 2308.

However, if at least one version of the LC-SBC frame passes the 8-bit CRC at decision step 2318, then control flows to step 2320. The final LC-SBC frame is constructing by modifying a version of the LC-SBC frame that passed the 8-bit CRC to include the majority-decision representations of the sub-band samples. LC-SBC decoding is then applied to the final LC-SBC frame to generate a corresponding frame of the output audio signal as shown at step 2306. The generated frame is then output at step 2308.

As will be appreciated by persons skilled in the relevant art(s), each of the steps of flowcharts 2100, 2200 and 2300 described above in reference to FIGS. 21, 22 and 23, respectively, may be performed by hardware, such as by appropriately designed analog and/or digital circuits, by software, through the execution of appropriate instructions by one or more general purpose or special-purpose processors, or by a combination of appropriately-configured hardware and software. In one embodiment, a separate software or hardware module is implemented that performs the function described in each step of each flowchart. Thus, these flowcharts 2100, 2200 and 2300 may also be viewed as describing modules that perform particular functions.

C. Example Computer System Implementation

Figure 24:
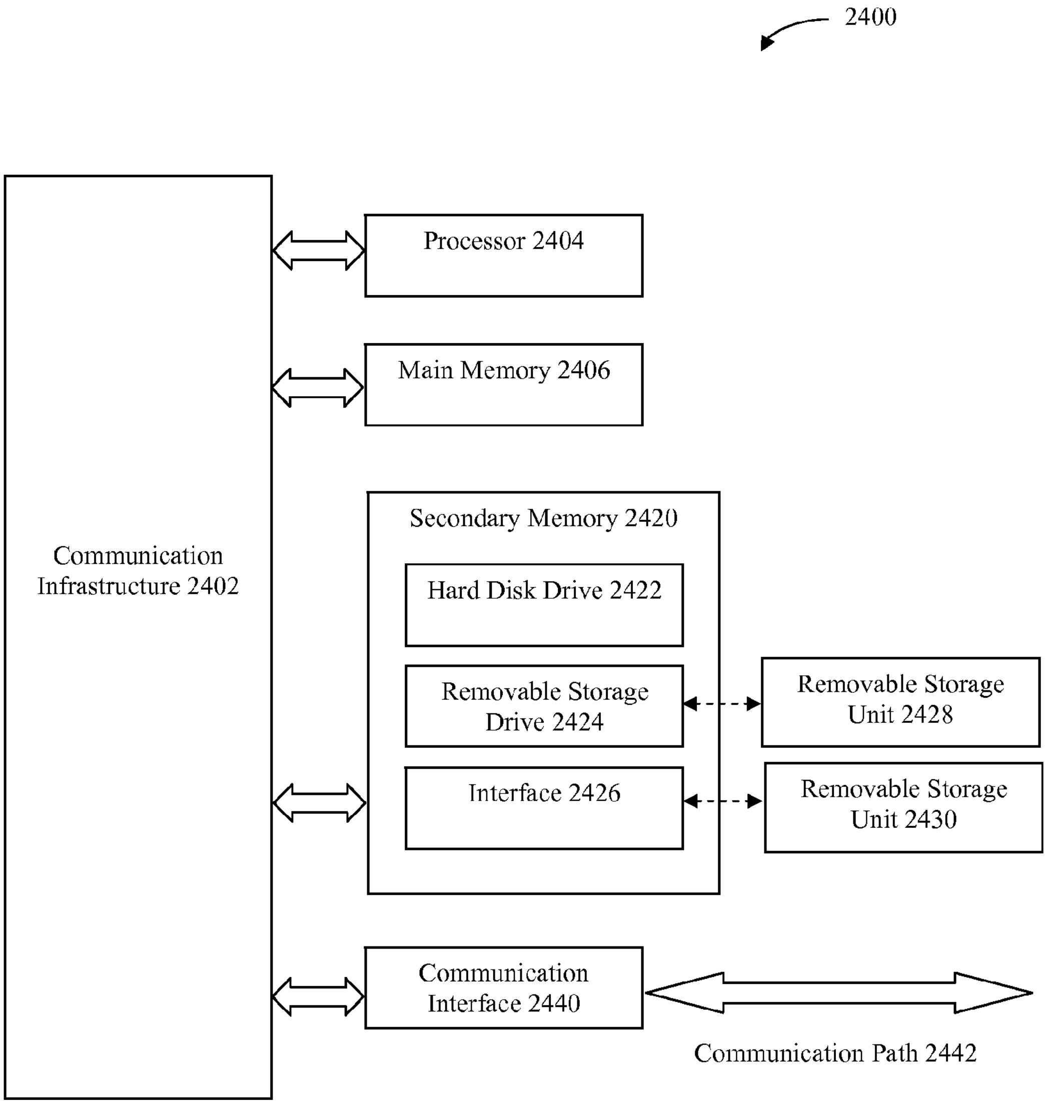
FIG. 24 depicts a computer system that may be used to implement features of the present invention.

The following description of a general purpose computer system is provided for the sake of completeness. The present invention can be implemented in hardware, or as a combination of software and hardware. Consequently, the invention may be implemented in the environment of a computer system or other processing system. An example of such a computer system 2400 is shown in FIG. 24.

Computer system 2400 includes one or more processors, such as processor 2404. Processor 2404 can be a special purpose or a general purpose digital signal processor. Processor 2404 is connected to a communication infrastructure 2402 (for example, a bus or network). Various software implementations are described in terms of this exemplary computer system. After reading this description, it will become apparent to a person skilled in the relevant art(s) how to implement the invention using other computer systems and/or computer architectures.

Computer system 2400 also includes a main memory 2406, preferably random access memory (RAM), and may also include a secondary memory 2420. Secondary memory 2420 may include, for example, a hard disk drive 2422 and/or a removable storage drive 2424, representing a floppy disk drive, a magnetic tape drive, an optical disk drive, or the like. Removable storage drive 2424 reads from and/or writes to a removable storage unit 2428 in a well known manner. Removable storage unit 2428 represents a floppy disk, magnetic tape, optical disk, or the like, which is read by and written to by removable storage drive 2424. As will be appreciated by persons skilled in the relevant art(s), removable storage unit 2428 includes a computer usable storage medium having stored therein computer software and/or data.

In alternative implementations, secondary memory 2420 may include other similar means for allowing computer programs or other instructions to be loaded into computer system 2400. Such means may include, for example, a removable storage unit 2430 and an interface 2426. Examples of such means may include a program cartridge and cartridge interface (such as that found in video game devices), a removable memory chip (such as an EPROM, or PROM) and associated socket, and other removable storage units 2430 and interfaces 2426 which allow software and data to be transferred from removable storage unit 2430 to computer system 2400.

Computer system 2400 may also include a communications interface 2440. Communications interface 2440 allows software and data to be transferred between computer system 2400 and external devices. Examples of communications interface 2440 may include a modem, a network interface (such as an Ethernet card), a communications port, a PCMCIA slot and card, etc. Software and data transferred via communications interface 2440 are in the form of signals which may be electronic, electromagnetic, optical, or other signals capable of being received by communications interface 2440. These signals are provided to communications interface 2440 via a communications path 2442. Communications path 2442 carries signals and may be implemented using wire or cable, fiber optics, a phone line, a cellular phone link, an RF link and other communications channels.

As used herein, the terms "computer program medium" and "computer usable medium" are used to generally refer to media such as removable storage units 2428 and 2430 or a hard disk installed in hard disk drive 2422. These computer program products are means for providing software to computer system 2400.

Computer programs (also called computer control logic) are stored in main memory 2406 and/or secondary memory 2420. Computer programs may also be received via communications interface 2440. Such computer programs, when executed, enable the computer system 2400 to implement the present invention as discussed herein. In particular, the computer programs, when executed, enable processor 2400 to implement the processes of the present invention, such as any of the methods described herein. Accordingly, such computer programs represent controllers of the computer system 2400. Where the invention is implemented using software, the software may be stored in a computer program product and loaded into computer system 2400 using removable storage drive 2424, interface 2426, or communications interface 2440.

In another embodiment, features of the invention are implemented primarily in hardware using, for example, hardware components such as application-specific integrated circuits (ASICs) and gate arrays. Implementation of a hardware state machine so as to perform the functions described herein will also be apparent to persons skilled in the relevant art(s).

D. Conclusion

While various embodiments of the present invention have been described above, it should be understood that they have been presented by way of example only, and not limitation. It will be understood by those skilled in the relevant art(s) that various changes in form and details may be made to the embodiments of the present invention described herein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A method in a receiver for concealing bit errors in an encoded representation of an audio signal, comprising:

decoding a plurality of bits included in the encoded representation of the audio signal segment to obtain a sub-band signal;

generating a prediction error signal by calculating a difference between a predicted version of the sub-band signal and the sub-band signal;

generating at least one error magnitude signal by determining a difference between the sub-band signal and a modified version of the sub-band signal, the modified version of the sub-band signal being obtained by changing, by the receiver, the value of one or more bits in an encoded representation of each sub-band sample in the sub-band signal, and decoding the modified encoded representations of the sub-band samples;

comparing the at least one error magnitude signal to the prediction error signal to identify at least one bit in the plurality of bits that is in error; and correcting, by the receiver, the at least one bit identified in the plurality of bits that is in error.

2. The method of claim 1, wherein decoding the plurality of bits included in the encoded representation of the audio signal to obtain the sub-band signal comprises:

decoding a plurality of bits in an encoded frame to obtain a lowest-frequency sub-band signal associated with the frame.

3. The method of claim 1, further comprising:

generating the predicted version of the sub-band signal based on a previously-decoded sub-band signal.

4. The method of claim 3, wherein generating the predicted version of the sub-band signal comprises calculating a prediction filter based at least on a pitch period obtained from analyzing a full-band audio signal obtained from synthesizing the previously-decoded sub-band signal and on short-term filter coefficients obtained by analyzing the previously-decoded sub-band signal.

5. The method of claim 1, wherein the sub-band signal comprises a plurality of sub-band samples and wherein generating the at least one error magnitude signal comprises:

changing a value of a first most significant bit in the encoded representation of each sub-band sample in the sub-band signal to obtain the modified encoded representation of each sub-band sample; and decoding the modified encoded representations of the sub-band samples to generate an error magnitude signal.

6. The method of claim 1, wherein the sub-band signal comprises a plurality of sub-band samples and wherein generating the at least one error magnitude signal comprises:

changing a value of a second most significant bit in the encoded representation of each sub-band sample in the sub-band signal to obtain the modified encoded representation of each sub-band sample; and decoding the modified encoded representations of the sub-band samples to generate an error magnitude signal.

7. The method of claim 1, wherein the sub-band signal comprises a plurality of sub-band samples and wherein generating the at least one error magnitude signal comprises:

changing a value of a first and second most significant bits in the encoded representation of each sub-band sample in the sub-band signal to obtain the modified encoded representation of each sub-band sample; and decoding the modified encoded representations of the sub-band samples to generate an error magnitude signal.

8. The method of claim 1, wherein comparing the at least one error magnitude signal to the prediction error signal to identify the at least one bit in the plurality of bits that is in error comprises:

determining if a magnitude of a difference between an amplitude of a sample of the prediction error signal and an amplitude of a corresponding sample of the at least one error magnitude signal is less than a predefined value.

9. The method of claim 1, further comprising:

determining that a sample in the sub-band signal is in error based on a magnitude of a corresponding sample of the prediction error signal; and replacing the sample of the sub-band signal that is determined to be in error by a corresponding sample of the predicted version of the sub-band signal.

10. The method of claim 1, further comprising:

performing packet loss concealment to generate an output audio signal corresponding to the encoded representation of the audio signal responsive to failing to identify and correct any bit(s).

11. A system, comprising:

a processor included in a receiver; and a memory containing a program, which when executed by the processor, is configured to detect and correct bit errors in an encoded representation of an audio signal, the program further performing:

decoding a plurality of bits included in the encoded representation of the audio signal segment to obtain a sub-band signal;

generating a prediction error signal by calculating a difference between a predicted version of the sub-band signal and the sub-band signal;

generating at least one error magnitude signal by determining a difference between the sub-band signal and a modified version of the sub-band signal, the modified version of the sub-band signal being obtained by changing, by the receiver, the value of one or more bits in an encoded representation of each sub-band sample in the sub-band signal, and decoding the modified encoded representations of the sub-band samples;

comparing the at least one error magnitude signal to the prediction error signal to identify at least one bit in the plurality of bits that is in error; and correcting, by the receiver, the at least one bit identified in the plurality of bits that is in error.

12. The system of claim 11, wherein said decoding comprises:

decoding a plurality of bits in an encoded frame to obtain a lowest-frequency sub-band signal associated with the frame.

13. The system of claim 11, the program further performing:

generating the predicted version of the sub-band signal based on a previously-decoded sub-band signal.

14. The system of claim 11, wherein the sub-band signal comprises a plurality of sub-band samples and wherein said generating at least one error magnitude signal comprises:

changing a value of a first most significant bit in the encoded representation of each sub-band sample in the sub-band signal to obtain a first modified encoded representation of each sub-band sample; and decoding the first modified encoded representations of the sub-band samples to generate a first error magnitude signal.

15. The system of claim 14, wherein said generating at least one error magnitude signal comprises:

changing a value of a second most significant bit in the encoded representation of each sub-band sample in the sub-band signal to obtain a second modified encoded representation of each sub-band sample; and decoding the second modified encoded representations of the sub-band samples to generate a second error magnitude signal.

16. The system of claim 15, wherein said generating at least one error magnitude signal comprises:

changing a value of the first and second most significant bits in the encoded representation of each sub-band sample in the sub-band signal to obtain a third modified encoded representation of each sub-band sample; and decoding the third modified encoded representations of the sub-band samples to generate a third error magnitude signal.

17. The system of claim 11, wherein said comparing comprises:

determining if a magnitude of a difference between an amplitude of a sample of the prediction error signal and an amplitude of a corresponding sample of the at least one error magnitude signal is less than a predefined value.

18. The system of claim 11, the program further performing:

determining that a sample in the sub-band signal is in error based on a magnitude of a corresponding sample of the prediction error signal; and replacing the sample of the sub-band signal that is determined to be in error by a corresponding sample of the predicted version of the sub-band signal.

19. The system of claim 11, the program further performing:

performing packet loss concealment to generate an output audio signal corresponding to the encoded representation of the audio signal responsive to failing to identify and correct any bit(s).

20. A non-transitory computer readable storage medium having computer program instructions embodied in said computer readable storage medium for enabling a processor in a receiver to detect and correct bit errors in an encoded representation of an audio signal, the computer program instructions including instructions executable to perform operations comprising:

decoding a plurality of bits included in the encoded representation of the audio signal segment to obtain a sub-band signal;

generating a prediction error signal by calculating a difference between a predicted version of the sub-band signal and the sub-band signal;

generating at least one error magnitude signal by determining a difference between the sub-band signal and a modified version of the sub-band signal, the modified version of the sub-band signal being obtained by changing, by the receiver, the value of one or more bits in an encoded representation of each sub-band sample in the sub-band signal, and decoding the modified encoded representations of the sub-band samples;

comparing the at least one error magnitude signal to the prediction error signal to identify at least one bit in the plurality of bits that is in error; and correcting, by the receiver, the at least one bit identified in the plurality of bits that is in error.

* * * * *